United States Patent
Goh et al.

(10) Patent No.: US 7,838,332 B2
(45) Date of Patent: Nov. 23, 2010

(54) METHOD OF MANUFACTURING A SEMICONDUCTOR PACKAGE WITH A BUMP USING A CARRIER

(75) Inventors: Soon Lock Goh, Mutiara (MY); Chau Fatt Chiang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 12/324,327

(22) Filed: Nov. 26, 2008

(65) Prior Publication Data

US 2010/0129964 A1      May 27, 2010

(51) Int. Cl.
  *H01L 21/00* (2006.01)
(52) U.S. Cl. .............................. 438/106; 257/E21.499; 257/E21.503
(58) Field of Classification Search ................. 438/118, 438/613, 124, 459, 106, 127; 257/E21.503, 257/678, 700, E21.499
See application file for complete search history.

(56) References Cited

U.S. PATENT DOCUMENTS

| | | |
|---|---|---|
| 6,159,770 A | 12/2000 | Tetaka et al. |
| 2002/0074147 A1 | 6/2002 | Tan et al. |
| 2004/0175864 A1 | 9/2004 | Mahle |
| 2005/0242417 A1 | 11/2005 | Youn et al. |
| 2005/0258521 A1 | 11/2005 | Park et al. |
| 2005/0260795 A1 | 11/2005 | Park et al. |
| 2010/0029046 A1* | 2/2010 | Camacho et al. ............. 438/118 |
| 2010/0124802 A1 | 5/2010 | Chiang et al. |

OTHER PUBLICATIONS

Quirk et al, "Semiconductor Manufacturing Technology", 2001, Prentice-Hall, Inc., pp. 435-445.*

* cited by examiner

*Primary Examiner*—Thomas L Dickey
*Assistant Examiner*—Nikolay Yushin
(74) *Attorney, Agent, or Firm*—Dicke, Billig & Czaja, PLLC

(57) ABSTRACT

A method of manufacturing a semiconductor package with a bump using a carrier. One embodiment provides forming a bump on a carrier. A gap is formed in the carrier that undercuts the bump. A semiconductor chip is attached to the carrier. The chip is electrically connected to the bump. An encapsulant is deposited into the gap. The carrier is removed from the bump.

20 Claims, 20 Drawing Sheets

METHOD OF MANUFACTURING A SEMICONDUCTOR PACKAGE WITH A BUMP USING A CARRIER

BACKGROUND

The present invention generally relates to semiconductor packaging, and to a method of manufacturing a semiconductor package.

Semiconductor chips include input/output pads that are electrically connected to external circuitry such as terminals in order to function as part of an electronic system. The terminals are typically a lead array such as lead frame. The electrical connections between the chip and the terminals is often achieved by wire bonding, tape automated bonding (TAB) or flip-chip bonding.

Semiconductor packages typically include the chip, the terminals, the electrical connections and an encapsulant. The terminals extend through the encapsulant and are exposed to the external environment for electrical connection to a substrate such as a printed circuit board (PCB), and the encapsulant protects the chip from the external environment to ensure reliability and performance.

Semiconductor packages are often referred to as leaded or leadless packages. In leaded packages, the terminals (or leads) protrude from the encapsulant, whereas in leadless packages, the terminals are aligned with or recessed relative to the encapsulant. For instance, ball grid array (BGA) packages contain an array of solder balls to post on corresponding metal traces on a printed circuit board, and land grid array (LGA) packages contain an array of contact pads that receive corresponding solder traces on a printed circuit board.

Semiconductor packages must constantly reduce size and improve performance and reliability.

In a one approach, a plating mask is provided on a metal carrier. A bump is electroplated on the carrier through an opening in the plating mask until the bump has a mushroom-like shape that includes a cylindrical stem that fills the opening and a hemispherical dome that extends above and laterally beyond the stem and the opening. The plating mask is stripped. A chip is mechanically attached to the carrier using an adhesive. The chip is electrically connected to the bump using a wire bond, An encapsulant is transfer molded on the chip, the bump, the wire bond and the carrier. The carrier is removed from the encapsulant to expose the bump. A contact pad is electrolessly plated on the bump. As a result, the encapsulant extends beneath and anchors the dome, thereby providing a mold lock for the bump.

A drawback to this approach is that the plating mask must be relatively thick in order to form the dome.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention provides a method of manufacturing a semiconductor package that has high performance, high reliability, low thickness, low manufacturing cost and robust attachment of the terminal to resist separation and delamination.

Figure 10A:
FIGS. 10A-10G illustrate cross-sectional views of a method of manufacturing a semiconductor package in accordance with one embodiment.
Figure 10B:
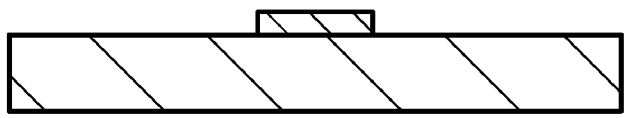
Figure 10C:
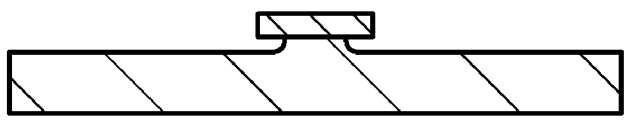
Figure 10D:
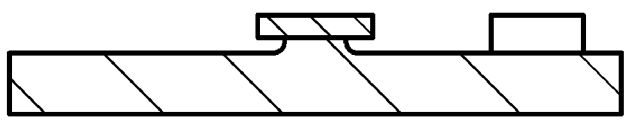
Figure 10E:
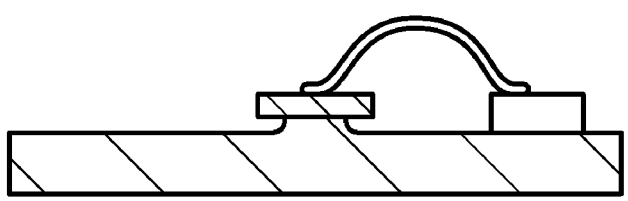
Figure 10F:
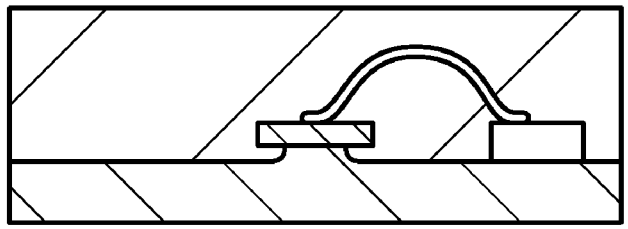
Figure 10G:
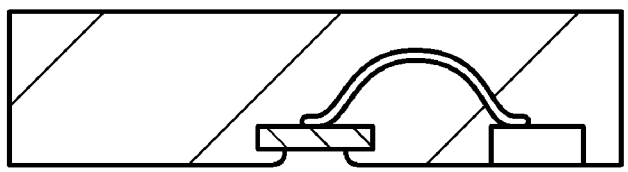

A method of manufacturing a semiconductor package includes providing a carrier (FIG. 10A), forming a bump on the carrier (FIG. 10B), forming a gap in the carrier that laterally undercuts the bump (FIG. 10C), mechanically attaching a semiconductor chip to the carrier (FIG. 10D), electrically connecting the chip to the bump (FIG. 10E), depositing an encapsulant into the gap (FIG. 10F), and removing the carrier from the bump (FIG. 10G).

These and other features and advantages of the present invention will become more apparent in view of the detailed description that follows.

FIGS. 1A-1L, 2A-2L and 3A-3L illustrate cross-sectional, top and bottom views, respectively, of a method of manufacturing a semiconductor package in accordance with one embodiment. In one embodiment, the semiconductor package is an LGA package with the terminal recessed relative to the encapsulant.

Figure 1A:
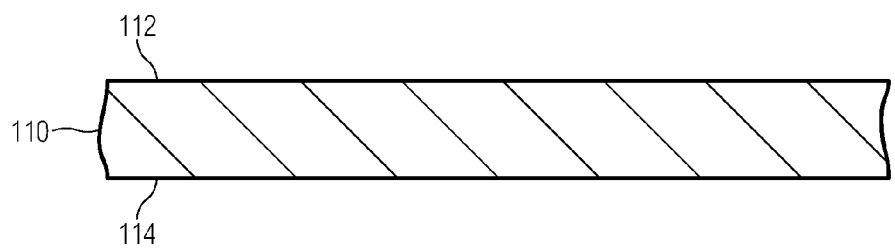
FIGS. 1A-1L illustrate cross-sectional views of a method of manufacturing a semiconductor package in accordance with one embodiment.
Figure 2A:
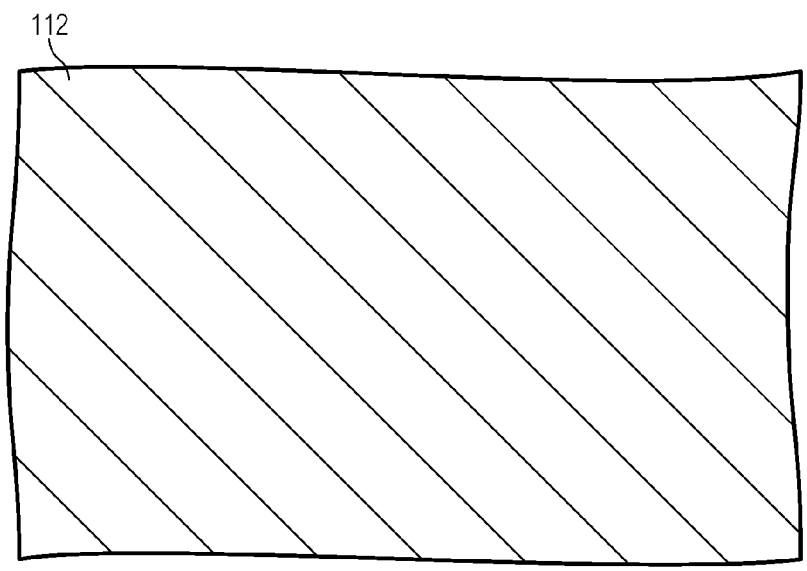
FIGS. 2A-2L illustrate top views that correspond to FIGS. 1A-1L, respectively.
Figure 3A:
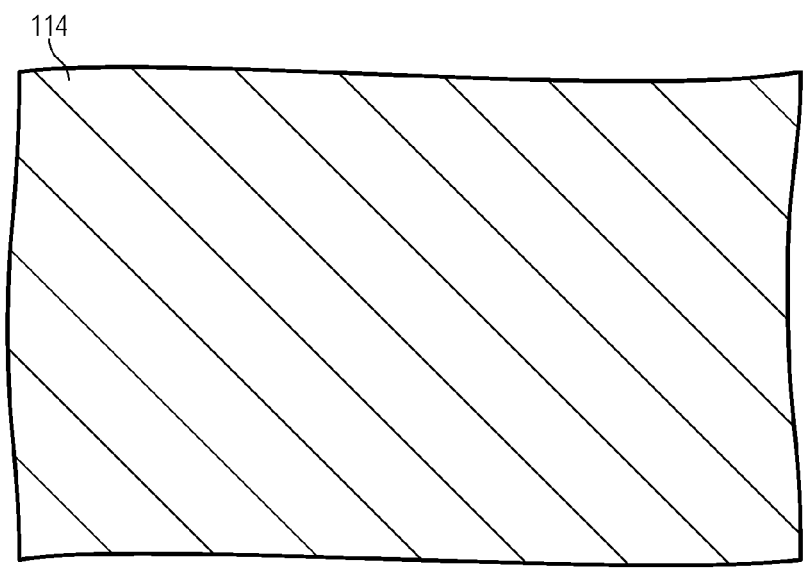
FIGS. 3A-3L illustrate bottom views that correspond to FIGS. 1A-1L, respectively.

FIGS. 1A, 2A and 3A illustrate cross-sectional, top and bottom views, respectively, of carrier 110 which is a copper frame that includes opposing major upper and lower surfaces 112 and 114. In one example, carrier 110 has a thickness (between surfaces 112 and 114) of 125 microns.

Upper surface 112 faces in the upward direction, lower surface 114 faces in the downward direction, and surfaces 112 and 114 extend laterally in the horizontal direction orthogonal to the upward and downward directions. Thus, the height (thickness) extends in the upward and downward (vertical) directions, and the length and width extend in lateral (horizontal) directions that are orthogonal to the upward and downward directions and to one another. Likewise, the height extends upward and downward in the cross-sectional views, the length extends laterally from left-to-right in the cross-sectional, top and bottom views, and the width extends laterally from top-to-bottom in the top and bottom views.

Figure 1B:
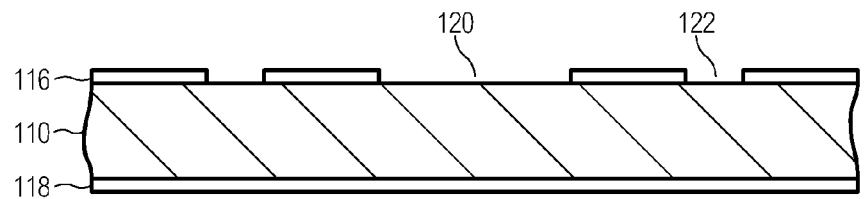
Figure 2B:
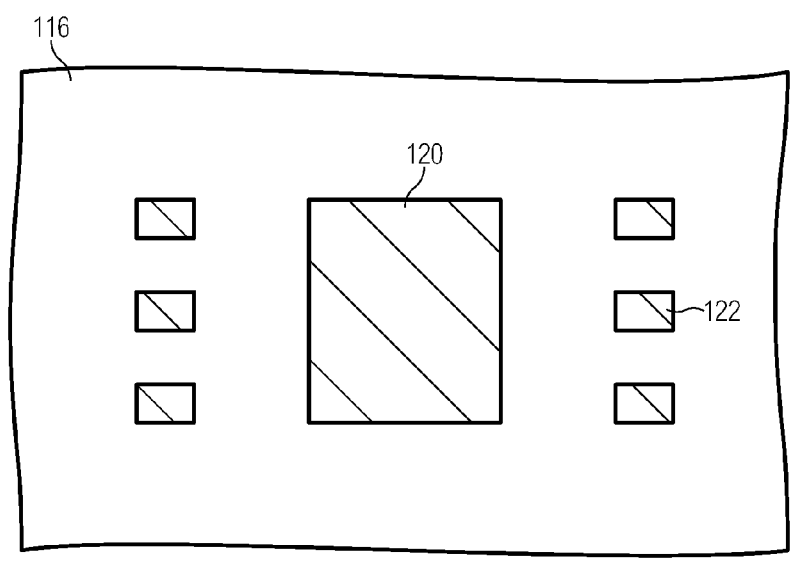
Figure 3B:
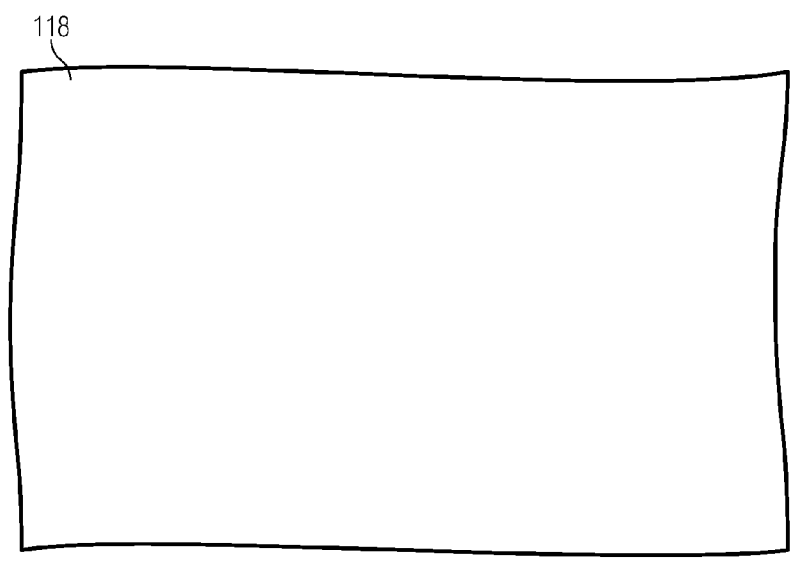

FIGS. 1B, 2B and 3B illustrate cross-sectional, top and bottom views, respectively, of photoresist layers 116 and 118 formed on carrier 110. Photoresist layers 116 and 118 are deposited on surfaces 112 and 114, respectively. Thereafter, photoresist layer 116 is patterned using a reticle to contain first opening 120 and second opening 122 that selectively expose separate spaced portions of upper surface 112, and photoresist layer 118 remains unpatterned and covers lower surface 114.

In one example, photoresist layers 116 and 118 have a thickness of 5 microns, first opening 120 has a length and width of 600×800 microns, second opening 122 has a length and width of 200×200 microns, and openings 120 and 122 are laterally spaced from one another by 250 microns.

Figure 1C:
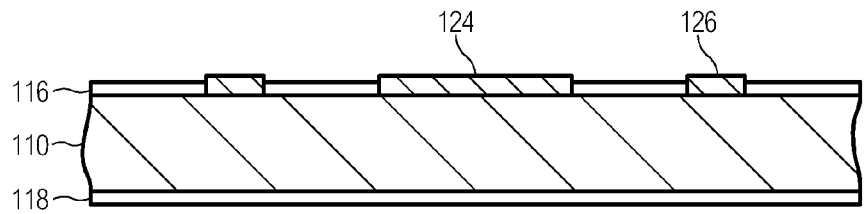
Figure 2C:
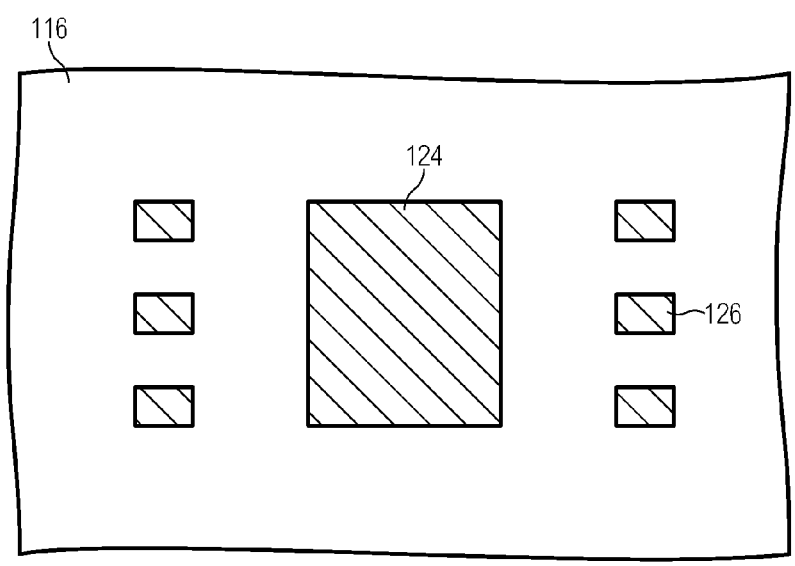
Figure 3C:
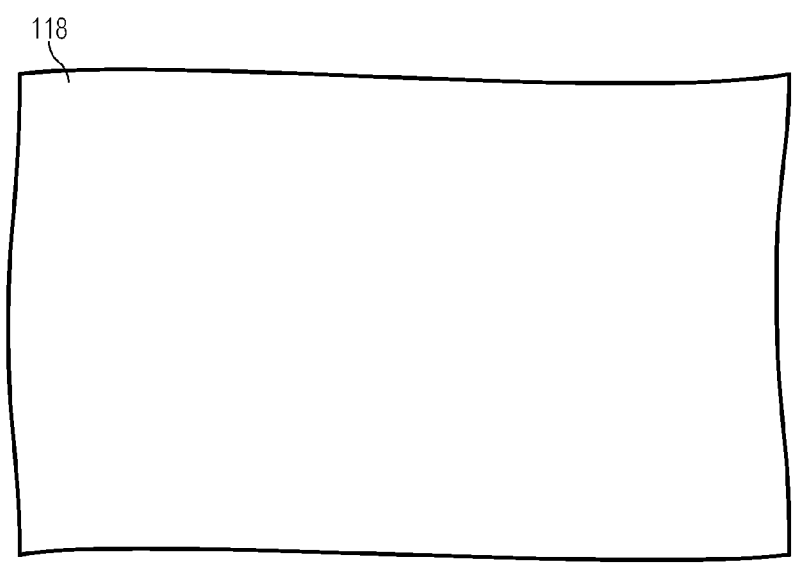

FIGS. 1C, 2C and 3C illustrate cross-sectional, top and bottom views, respectively, of first bump 124 and second bump 126 formed on carrier 110.

Bumps 124 and 126 are composed of a nickel layer electroplated on carrier 110 and a gold layer electroplated on the nickel layer. The nickel layer contacts and is sandwiched between carrier 110 and the gold layer, the gold layer contacts the nickel layer and is spaced from carrier 110. Thus, the nickel layer is buried beneath the gold layer, and the gold layer is exposed in the upward direction. Bumps 124 and 126 have a thickness of 7 microns. In particular, the nickel layer has a thickness of 5 microns and the gold layer has a thickness of 2 microns. For convenience of illustration, the nickel and gold layers are illustrated as a single layer.

Bumps 124 and 126 are simultaneously formed by an electroplating operation using photoresist layer 116 as a plating mask and photoresist layer 118 as a back-side protection mask. A plating bus (not illustrated) is connected to carrier 110, current is applied to the plating bus from an external power source, and carrier 110 is submerged in an electrolytic nickel plating solution. As a result, the nickel layer electroplates on carrier 110 in openings 120 and 122. The nickel electroplating operation continues until the nickel layer has the desired thickness. Thereafter, the structure is removed from the electrolytic nickel plating solution and submerged in an electrolytic gold plating solution while current is applied to the plating bus to electroplate the gold layer on the nickel layer. The gold electroplating operation continues until the gold layer has the desired thickness. Thereafter, the structure is removed from the electrolytic gold plating solution and rinsed in distilled water.

In one example, first bump 124 has a length and width of 600×800 microns and a thickness of 7 microns, second bump 126 has a length and width of 200×200 microns and a thickness of 7 microns, and bumps 124 and 126 are laterally spaced from one another by 250 microns.

First bump 124 fills and extends slightly above first opening 120, second bump 126 fills and extends slightly above second opening 122, and bumps 124 and 126 are coplanar with one another at their upper and lower surfaces.

Figure 1D:
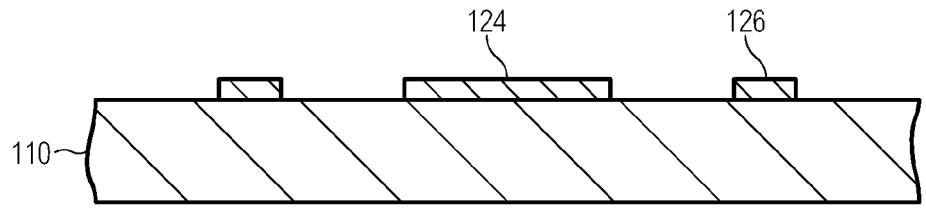
Figure 2D:
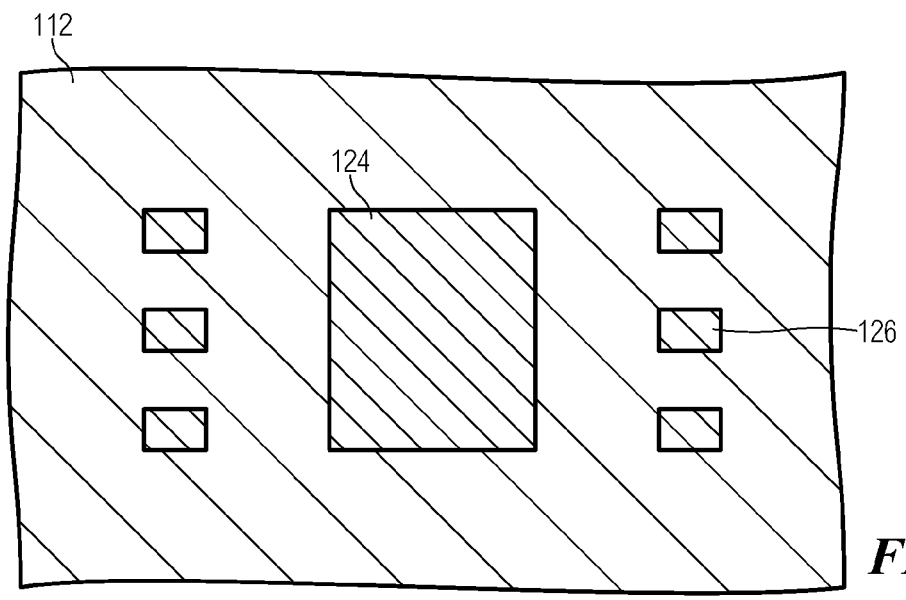
Figure 3D:
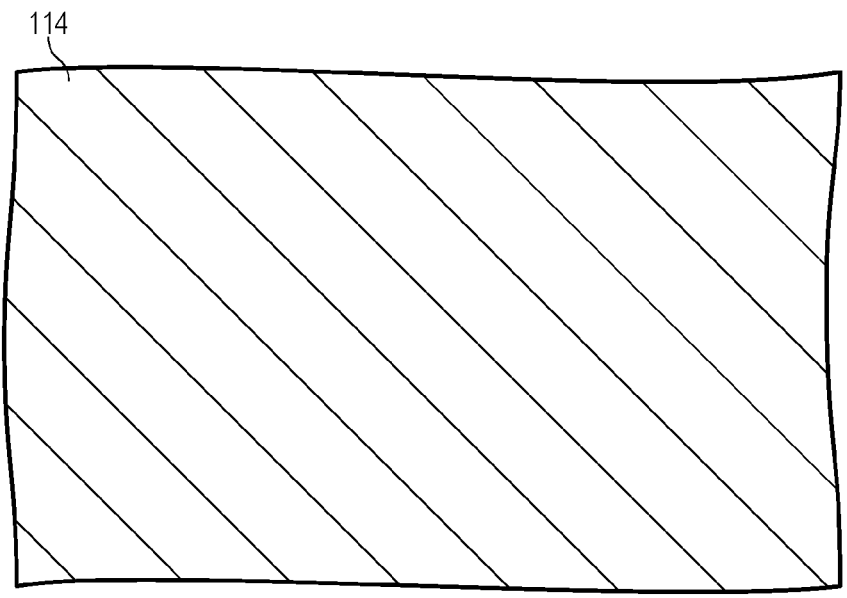

FIGS. 1D, 2D and 3D are cross-sectional, top and bottom views, respectively, of carrier 110, first bump 124 and second bump 126 after photoresist layers 116 and 118 are removed from carrier 110.

Figure 1E:
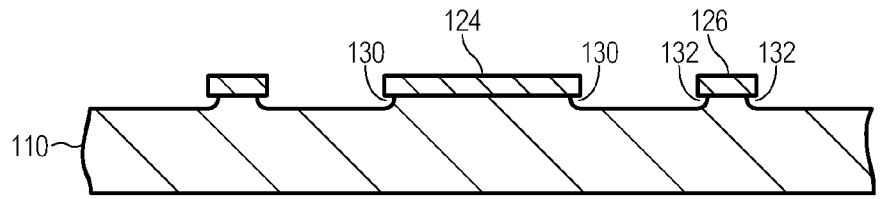
Figure 2E:
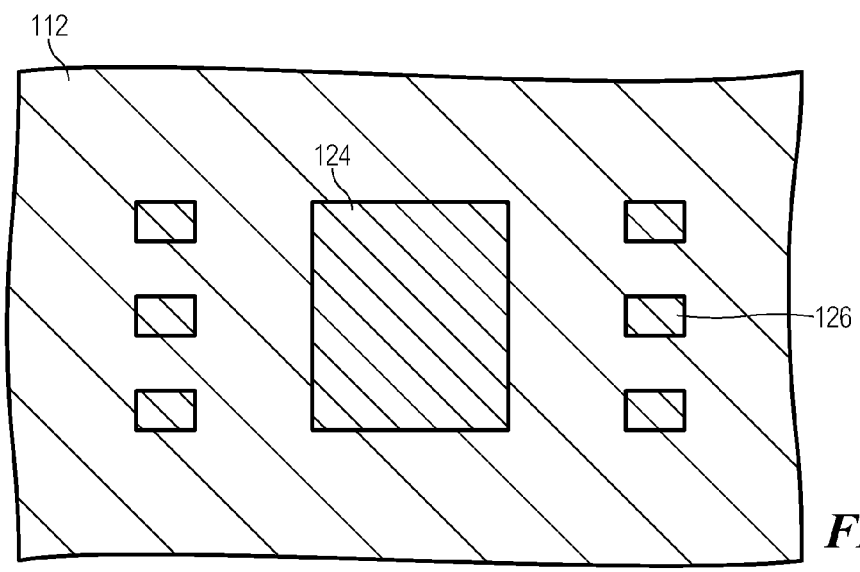
Figure 3E:
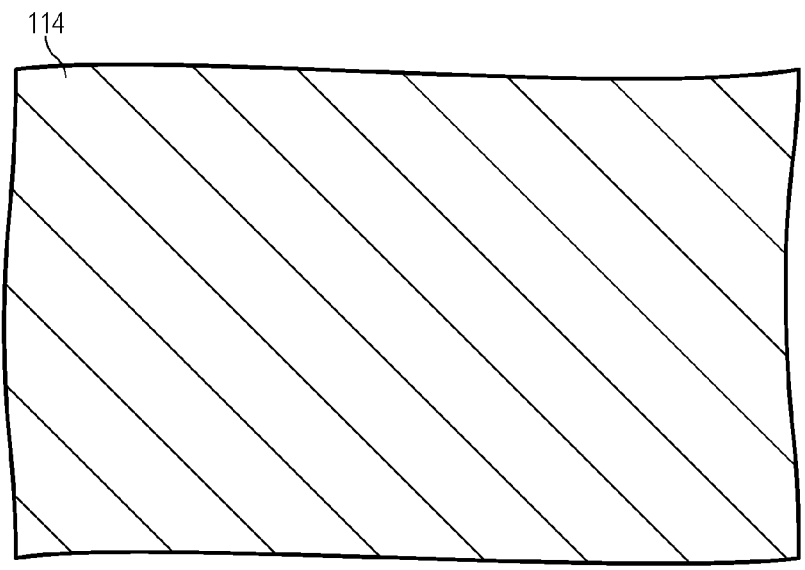

FIGS. 1E, 2E and 3E illustrate cross-sectional, top and bottom views, respectively, of first gap 130 and second gap 132 formed in carrier 110. Gaps 130 and 132 are formed by applying a front-side wet chemical etch to the exposed portions of upper surface 112 using bumps 124 and 126 as etch masks. A spray nozzle (not illustrated) sprays the wet chemical etch on carrier 110 and bumps 124 and 126. The wet chemical etch is highly selective of copper with respect to nickel and gold and etches 15 microns into carrier 110 without appreciably affecting bumps 124 and 126. The wet chemical etch is isotropic and etches carrier 110 at roughly the same rate in the vertical and horizontal (lateral) directions. As a result, the wet chemical etch causes surface 112 to recess by 10 microns and forms gaps 130 and 132 in carrier 110 beneath bumps 124 and 126 using bumps 124 and 126 as etch masks. First gap 130 surrounds and extends within the periphery of and laterally undercuts and exposes the lower surface of first bump 124, and second gap 132 surrounds and extends within the periphery of and laterally undercuts and exposes the lower surface of second bump 126. Gaps 130 and 132 are laterally spaced from one another by 250 microns and are spaced from lower surface 114 by 115 microns and thus do not extend through carrier 110.

First gap 130 has a curved cross-sectional shape with a depth that decreases as it extends within the periphery of first bump 124, and second gap 132 has a curved cross-sectional shape with a depth that decreases as it extends within the periphery of second bump 124. Thus, first gap 130 forms an annular channel with a depth of 10 microns at the periphery of bump 124 and laterally undercuts and extends within the periphery of bump 124 by 8 microns, and second gap 132 forms an annular channel with a depth of 10 microns at the periphery of bump 126 and laterally undercuts and extends within the periphery of bump 126 by 8 microns.

Figure 1F:
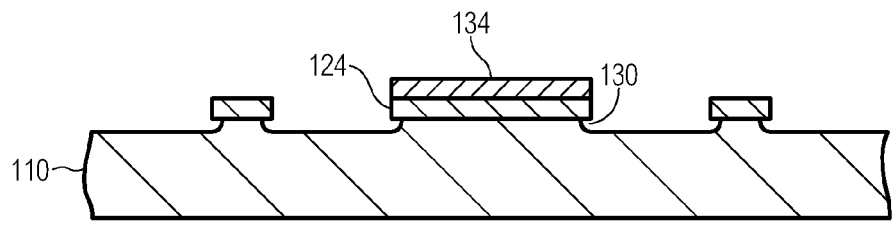
Figure 2F:
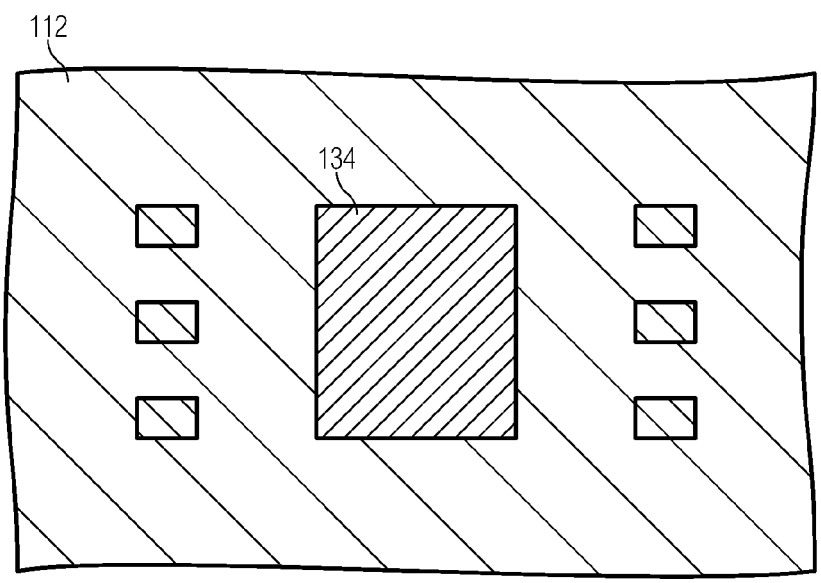
Figure 3F:
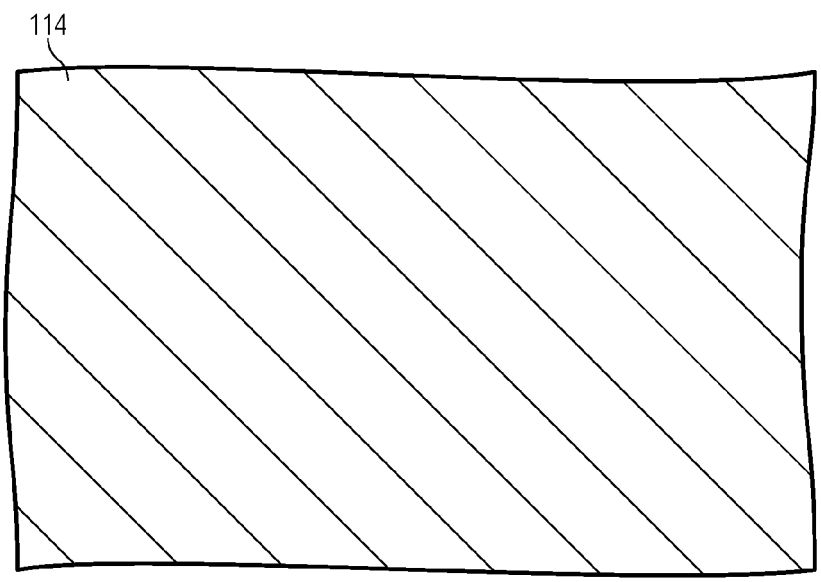

FIGS. 1F, 2F and 3F are cross-sectional, top and bottom views, respectively, of adhesive 134 formed on first bump 124.

Adhesive 134 is deposited as uncured epoxy (A stage) on first bump 124 using stencil printing. During stencil printing, a stencil (not illustrated) is placed on carrier 110, a stencil opening is aligned with first bump 124, and then a squeegee (not illustrated) pushes the uncured epoxy along the surface of the stencil opposite carrier 110, through the stencil opening and on first bump 124 but not into first gap 130. The uncured epoxy is compliant enough at room temperature to conform to virtually any shape.

Figure 1G:
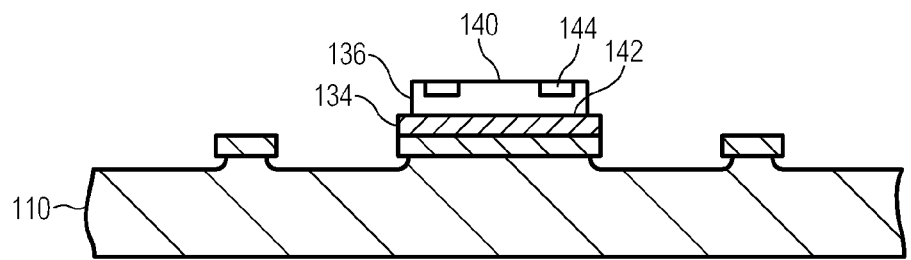
Figure 2G:
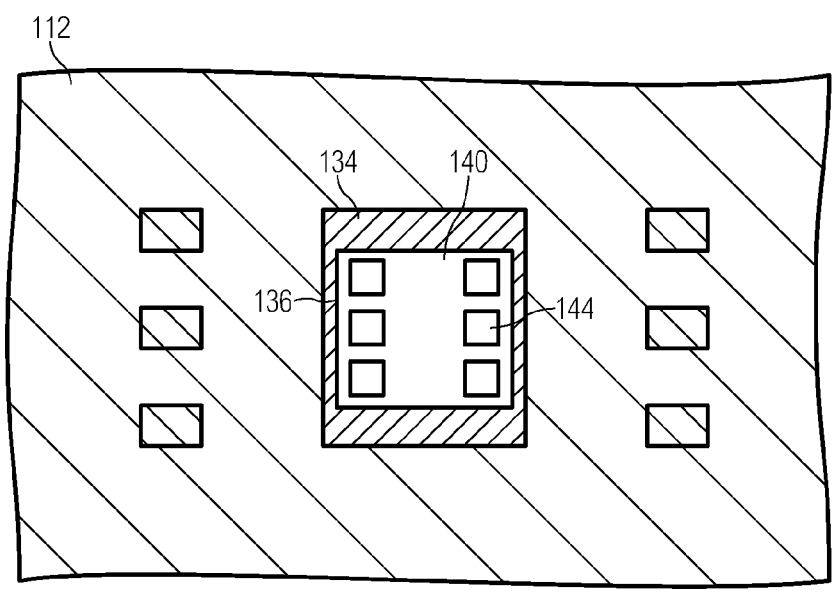
Figure 3G:
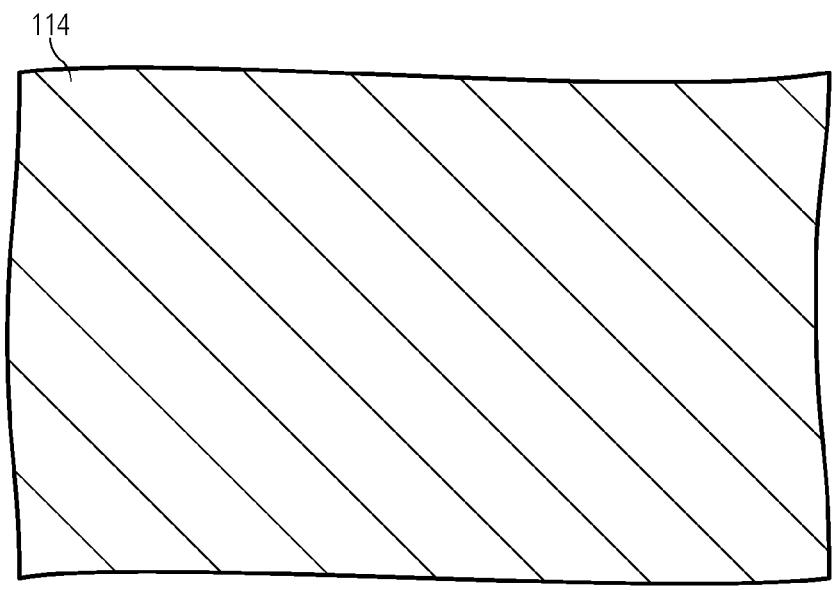

FIGS. 1G, 2G and 3G illustrate cross-sectional, top and bottom views, respectively, of semiconductor chip 136 mechanically attached to first bump 124 by adhesive 134.

Chip 136 is placed on adhesive 134 (which is still uncured epoxy) using a pick-up head (not illustrated) that applies low pressure, briefly holds chip 136 against adhesive 134 and then releases chip 136. Thus, adhesive 134 loosely mechanically attaches chip 136 to first bump 124. Thereafter, adhesive 134 is heated to a relatively low but higher temperature such as 250° C. to convert the uncured epoxy into cured epoxy (C stage) that rigidly mechanically attaches chip 136 to first bump 124.

Adhesive 134 is a die attach epoxy that contacts and is sandwiched between and mechanically attaches chip 136 to first bump 124. Adhesive 134 has a thickness of 10 microns (between first bump 124 and chip 136).

Chip 136 is an integrated circuit that includes opposing major upper and lower surfaces 140 and 142. Upper surface 140 faces in the upward direction, and lower surface 142 faces in the downward direction. Chip 136 also includes chip pad 144 at upper surface 140 that transfers an electrical signal between chip 136 and external circuitry during operation of chip 136. In one example, chip 136 has a length and width of 500×500 microns and a thickness (between surfaces 140 and 142) of 75 microns, and chip pad 144 has a length and width of 50×50 microns.

Adhesive 134 and chip 136 are located outside first gap 130 (since they are located above first gap 130), and gaps 130 and 132 remain unfilled and exposed.

Figure 1H:
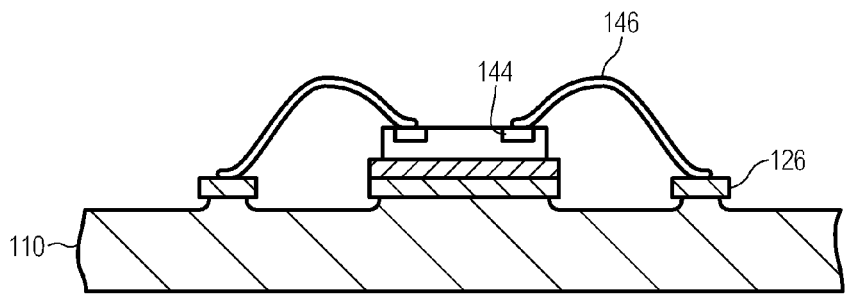
Figure 2H:
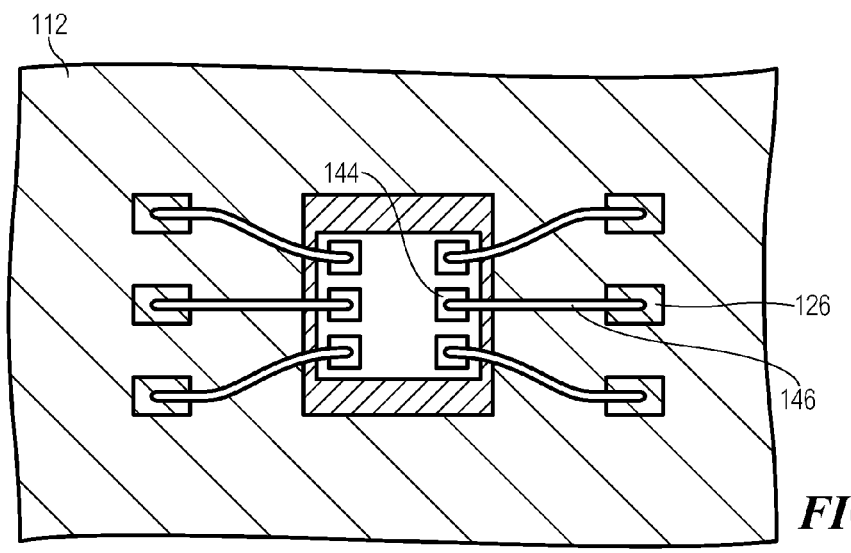
Figure 3H:
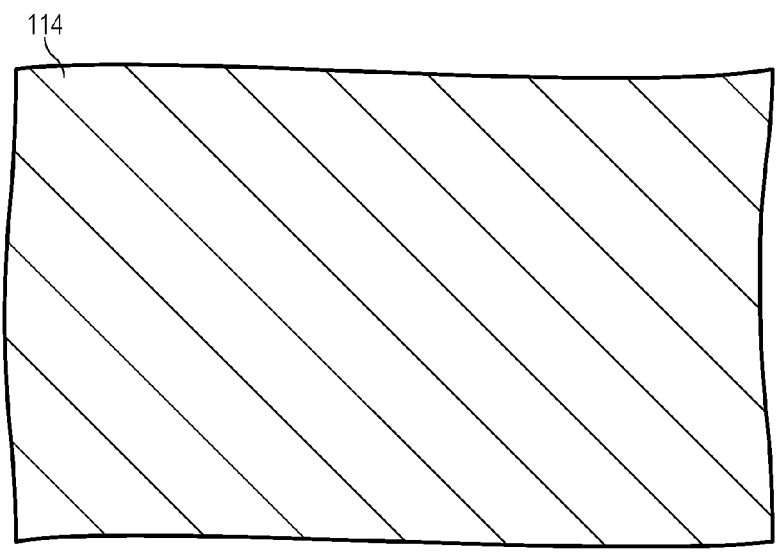

FIGS. 1H, 2H and 3H illustrate cross-sectional, top and bottom views, respectively, of wire bond 146 formed on second bump 126 and chip pad 144.

Wire bond 146 is a gold wire that is ball bonded to chip pad 144 and then wedge bonded to second bump 126. The gold wire between the ball bond and the wedge bond has a diameter of 25 microns. Thus, wire bond 146 contacts and electrically connects second bump 126 and chip pad 144.

Figure 1I:
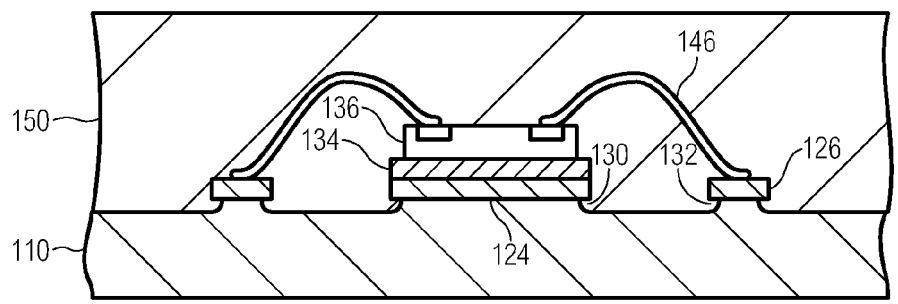
Figure 2I:
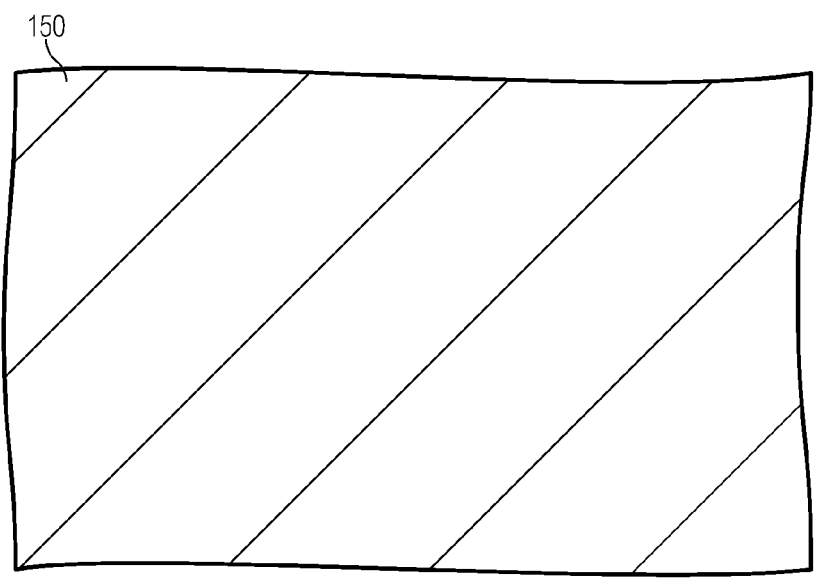
Figure 3I:
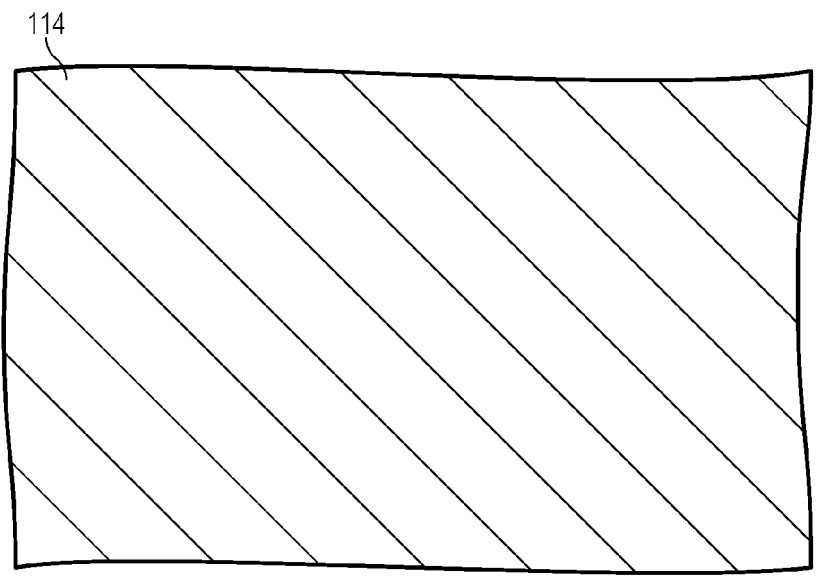

FIGS. 1I, 2I and 3I illustrate cross-sectional, top and bottom views, respectively, of encapsulant 150 formed on carrier 110, first bump 124, second bump 126, adhesive 134, chip 136 and wire bond 146.

Encapsulant 150 is deposited by transfer molding. Generally speaking, transfer molding involves forming components in a closed mold tool from a mold compound that is conveyed under pressure in a hot, plastic state from a central reservoir called the transfer pot through a tree-like array of runners and gates into closed cavities.

Encapsulant 150 contacts and extends above carrier 110, first bump 124, second bump 126, adhesive 134, chip 136 and wire bond 146, is located within the periphery of carrier 110, covers first bump 124, second bump 126, adhesive 134, chip 136 and wire bond 146 in the upward direction and fills gaps 130 and 132, thereby securely interlocking bumps 124 and 126 to itself and to the structure. Thus, encapsulant 150 extends into but not through carrier 110, contacts upper surface 112 and is spaced from lower surface 114, contacts carrier 110 and first bump 124 in first gap 130, contacts carrier 110 and second bump 126 in second gap 132 and protects chip 136 and wire bond 146.

In one example, encapsulant 150 in first gap 130 extends within the periphery of first bump 124 beneath first bump 124 and surrounds and contacts and covers in the downward direction the peripheral region of the lower surface of first bump 124 within the surface area of gap 130, and encapsulant 150 in second gap 132 extends within the periphery of second bump 126 beneath bump 126 and surrounds and contacts and covers in the downward direction the peripheral region of the lower surface of second bump 126 within the surface area of gap 132. However, encapsulant 150 does not contact or extend beneath the central regions of bumps 124 and 126 within and adjacent to the peripheral regions of bumps 124 and 126, which remain in contact with and covered in the downward direction by carrier 110.

Encapsulant 150 in first gap 130 has a curved cross-sectional shape with a thickness that decreases as it extends within the periphery of first bump 124, and encapsulant 150 in second gap 132 has a curved cross-sectional shape with a thickness that decreases as it extends within the periphery of second bump 126. Thus, encapsulant 150 in first gap 130 forms an annular mold lock with a thickness of 10 microns at the periphery of first bump 124 and decreases in thickness as it laterally extends within the periphery of first bump 124 by 8 microns, and encapsulant 150 in second gap 132 forms an annular mold lock with a thickness of 10 microns at the periphery of second bump 126 and decreases in thickness as it laterally extends within the periphery of second bump 126 by 8 microns.

In one example, encapsulant 150 is an electrically insulative epoxy mold compound that has a length of 1600 microns and a thickness (between its upper surface and its lower surface adjacent to upper surface 112) of 500 microns.

Figure 1J:
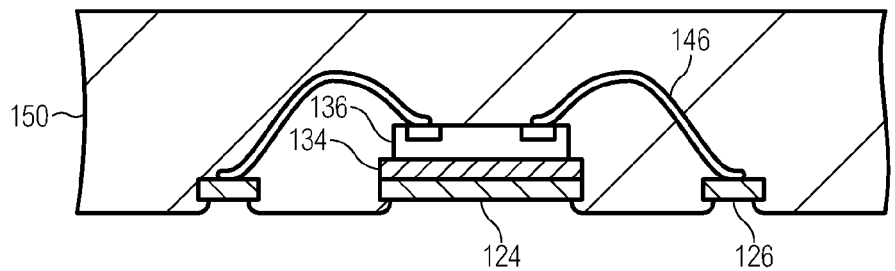
Figure 2J:
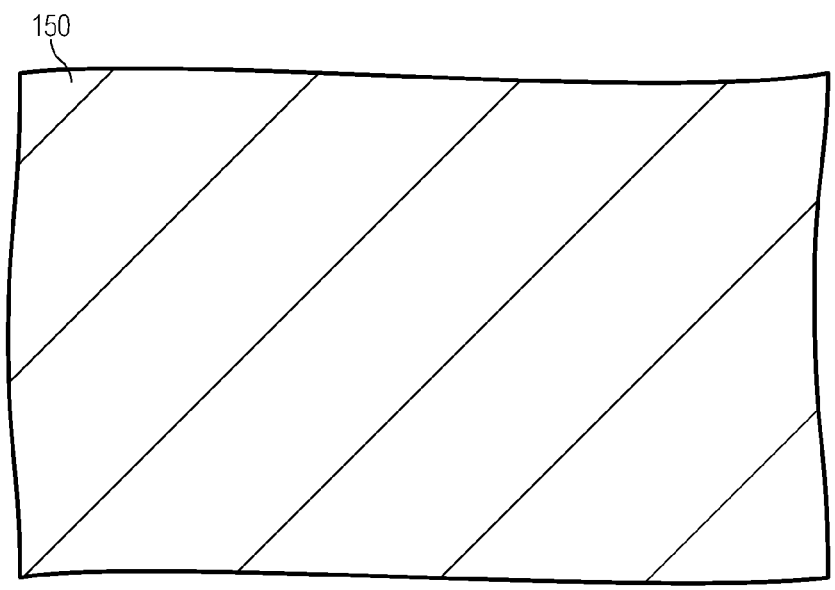
Figure 3J:
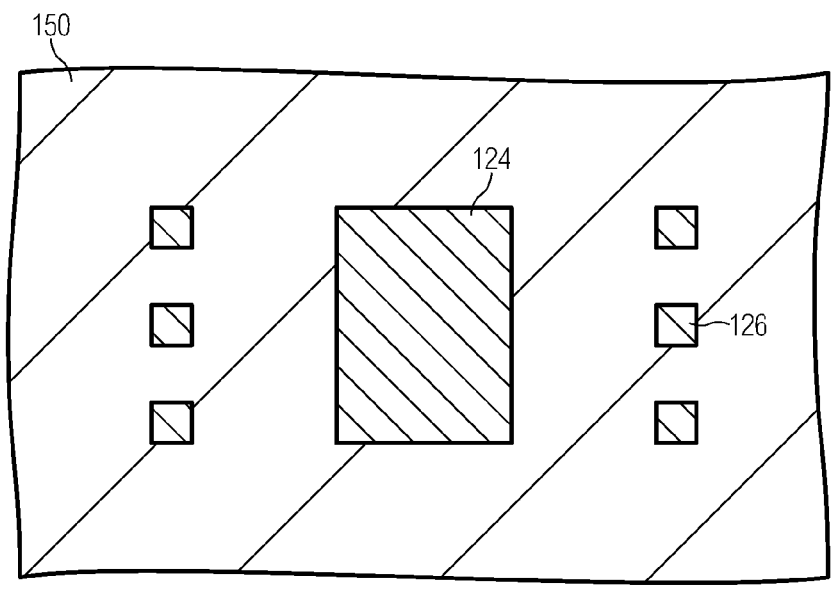

FIGS. 1J, 2J and 3J illustrate cross-sectional, top and bottom views, respectively, of first bump 124, second bump 126, adhesive 134, chip 136, wire bond 146 and encapsulant 150 after carrier 110 is removed from first bump 124, second bump 126 and encapsulant 150.

Carrier 110 is removed by applying a blanket back-side wet chemical etch to carrier 110, first bump 124, second bump 126 and encapsulant 150. A spray nozzle (not illustrated) sprays the wet chemical etch on lower surface 114 using encapsulant 150 as a front-side protection mask. The wet chemical etch is highly selective of copper with respect to nickel and the mold compound. Therefore, adhesive 134, chip 136 and wire bond 146 are not exposed to the wet chemical etch. The wet chemical etch removes carrier 110 without appreciably affecting first bump 124, second bump 126, adhesive 134, chip 136, wire bond 146 and encapsulant 150. As a result, the wet chemical etch exposes the lower surfaces of first bump 124, second bump 126 and encapsulant 150 in the downward direction. More particularly, the wet chemical etch exposes the central regions of bumps 124 and 126 that are not covered in the downward direction by encapsulant 150, but does not expose the peripheral regions of bumps 124 and 126 which remain covered in the downward direction by encapsulant 150 and thus securely interlocked to the structure.

Encapsulant 150 is illustrated extending above first bump 124, second bump 126, adhesive 134, chip 136 and wire bond 146 to retain a single orientation throughout the drawings, although in this process the structure is inverted so that gravitational force assists the wet chemical etch.

Figure 1K:
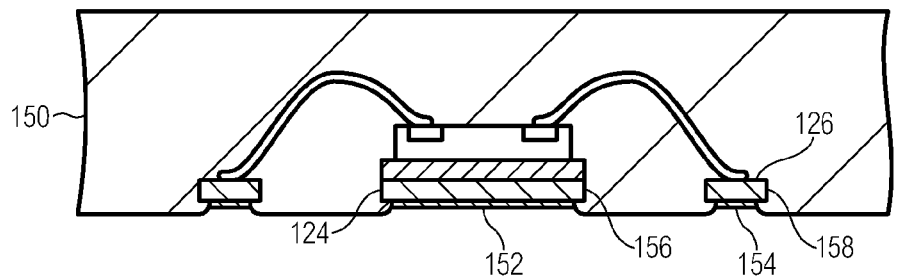
Figure 2K:
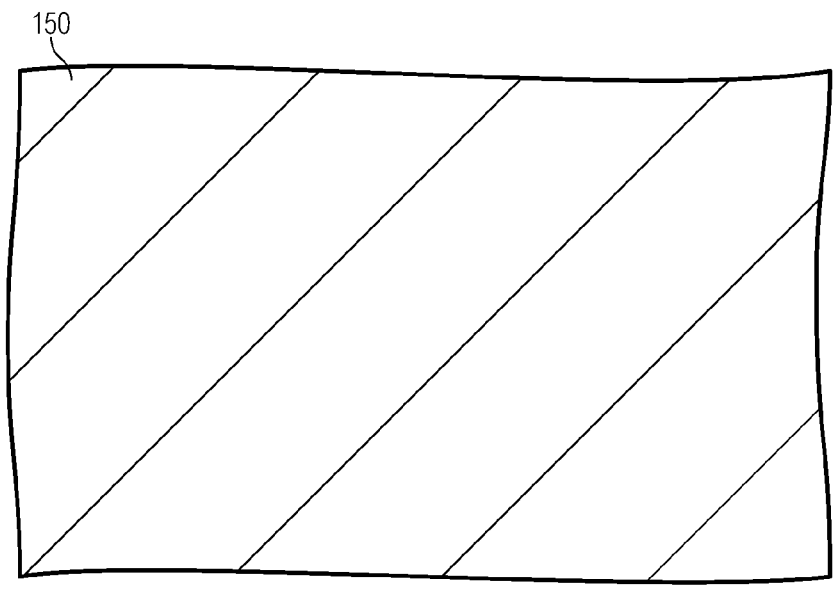
Figure 3K:
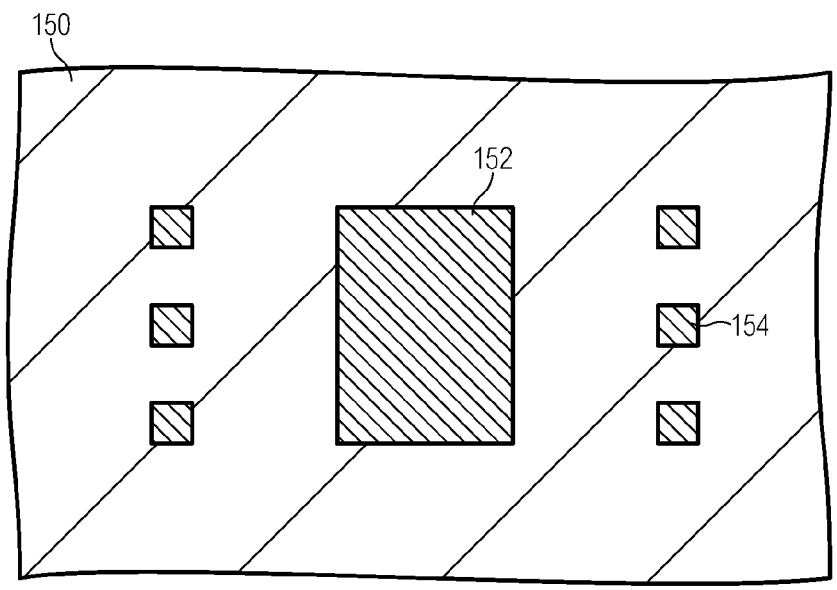

FIGS. 1K, 2K and 3K illustrate cross-sectional, top and bottom views, respectively, of first contact pad 152 and second contact pad 154 formed on first bump 124 and second bump 126.

Contact pads 152 and 154 are composed of a nickel-phosphorus layer electrolessly plated on the nickel layer and a gold layer electrolessly plated on the nickel-phosphorus layer. The nickel-phosphorus layer contacts and is sandwiched between the nickel layer and the gold layer, the gold layer contacts the nickel-phosphorus layer and is spaced from the nickel layer. Thus, the nickel-phosphorus layer is buried beneath the gold layer, and the gold layer is exposed in the downward direction. In one example, contact pads 152 and 154 have a thickness of 4.6 microns. The nickel-phosphorus layer has a thickness of 4.5 microns and the gold layer has a thickness of 0.1 microns. For convenience of illustration, the nickel-phosphorus and gold layers are illustrated as a single layer.

Contact pads 152 and 154 are simultaneously formed by an electroless plating operation using encapsulant 150 as a front-side protection mask and a back-side plating mask. The structure is submerged in an electroless nickel-phosphorus plating solution. As a result, the nickel-phosphorus layer electroplates on the nickel layer of bumps 124 and 126 at the exposed central regions of bumps 124 and 126. The nickel-phosphorus electroless plating operation continues until the nickel-phosphorus layer has the desired thickness. Thereafter, the structure is removed from the electroless nickel-phosphorus plating solution and submerged in an electroless gold plating solution to electrolessly plate the gold layer on the nickel-phosphorus layer. The gold electroplating operation continues until the gold layer has the desired thickness. Thereafter, the structure is removed from the electroless gold plating solution and rinsed in distilled water.

In one example, first contact pad 152 has a thickness of 4.6 microns, second contact pad 154 has a thickness of 4.6 microns, and contact pads 152 and 154 are laterally spaced from one another by 270 microns (250+10+10) and are recessed relative to encapsulant 150 by 5.4 microns (10–4.6). Furthermore, first contact pad 152 contacts and is electrically and thermally connected to first bump 124, and second contact pad 154 contacts and is electrically and thermally connected to second bump 126.

First terminal 156 is provided by first bump 124 and first contact pad 152, and second terminal 158 is provided by second bump 126 and second contact pad 154.

Figure 1L:
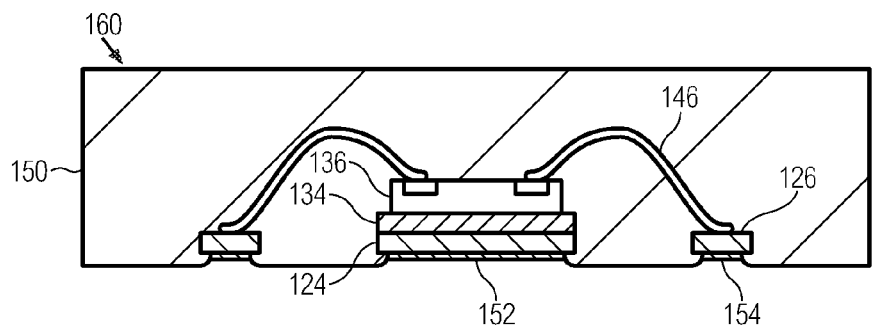
Figure 2L:
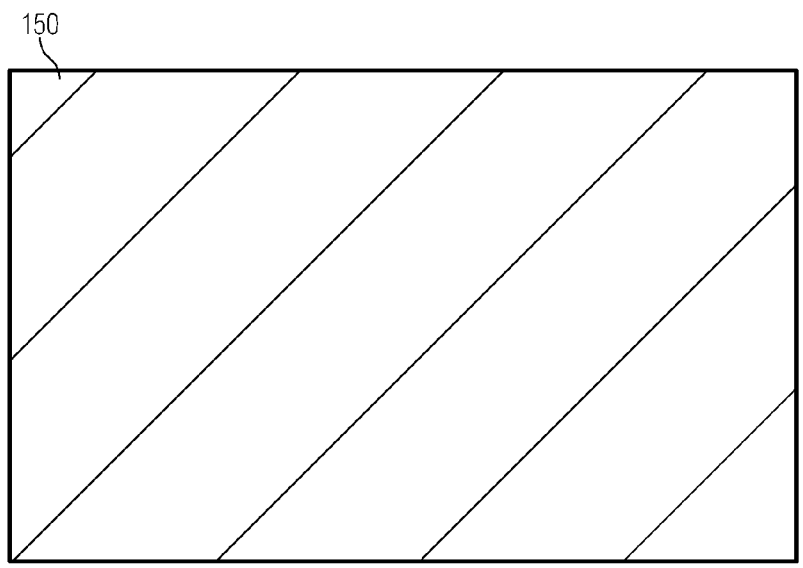
Figure 3L:
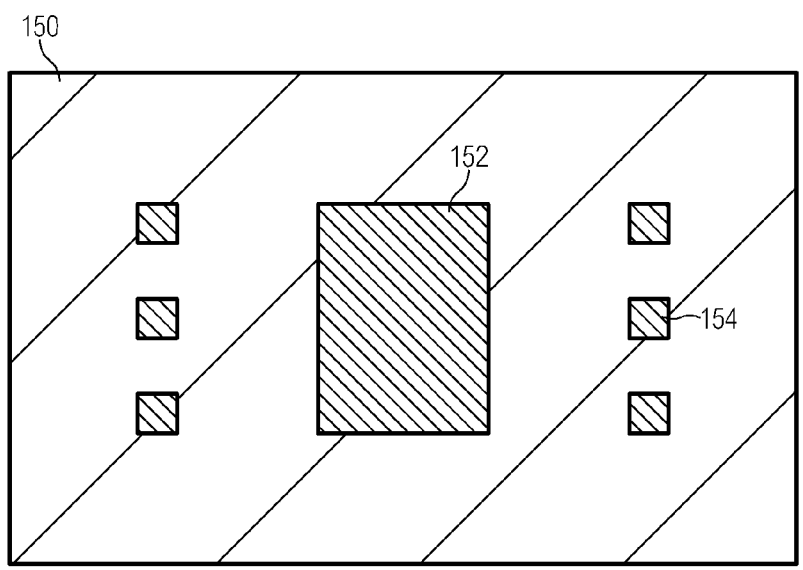

FIGS. 1L, 2L and 3L are cross-sectional, top and bottom views, respectively, of semiconductor package 160 that includes first bump 124, second bump 126, adhesive 134, chip 136, wire bond 146, encapsulant 150, first contact pad 152 and second contact pad 154 after encapsulant 150 is sawed with an excise blade at two opposing sides that extend lengthwise and two opposing sides that extend widthwise to singulate semiconductor package 160 from other semiconductor packages.

Semiconductor package 160 is a single-chip first-level LGA package in which terminals 156 and 158 are recessed relative to encapsulant 150.

FIGS. 4A-4C, 5A-5C and 6A-6C illustrate cross-sectional, top and bottom views, respectively, of a method of manufacturing a semiconductor package in accordance with a second embodiment. In the second embodiment, the semiconductor package is an LGA package with the terminal aligned with the encapsulant. For purposes of brevity, any description in the first embodiment is incorporated in the second embodiment and need not be repeated, and elements of the second embodiment similar to those in the first embodiment have corresponding reference numerals indexed at two-hundred rather than one-hundred. For instance, first bump 224 corresponds to first bump 124, second bump 226 corresponds to second bump 226, etc.

Figure 4A:
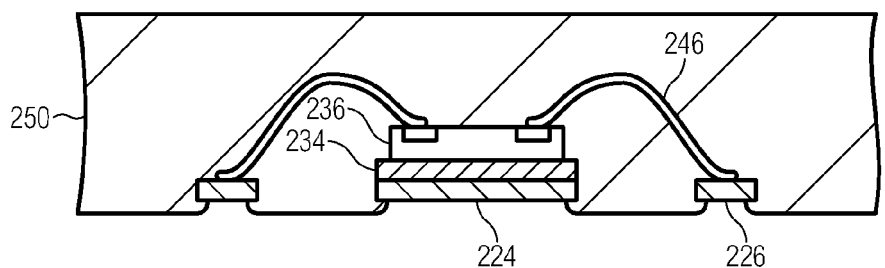
FIGS. 4A-4C illustrate cross-sectional views of a method of manufacturing a semiconductor package in accordance with one embodiment.
Figure 5A:
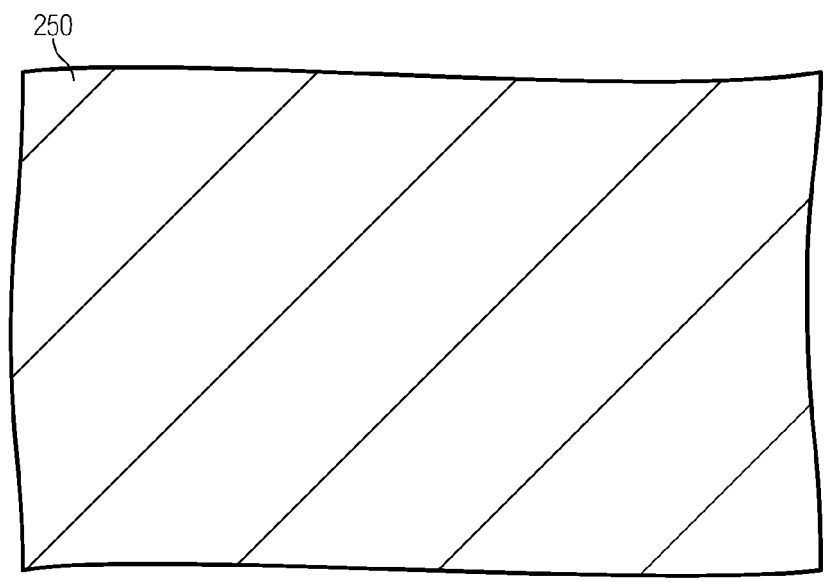
FIGS. 5A-5C illustrate top views that correspond to FIGS. 4A-4C, respectively.
Figure 6A:
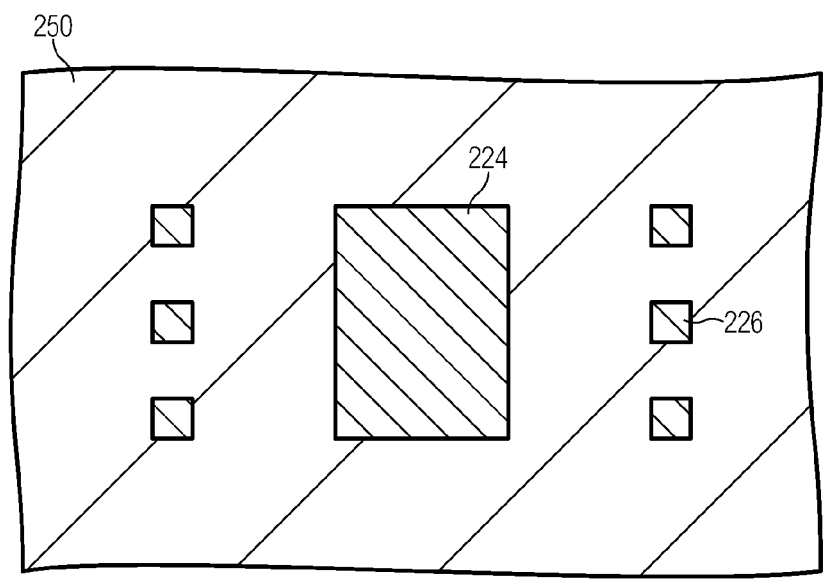
FIGS. 6A-6C illustrate bottom views that correspond to FIGS. 4A-4C, respectively.

FIGS. 4A, 5A and 6A illustrate cross-sectional, top and bottom views, respectively, of first bump 224, second bump 226, adhesive 234, chip 236, wire bond 246 and encapsulant 250 after the carrier (corresponding to carrier 110) is removed from first bump 224, second bump 226 and encapsulant 250. The structure corresponds to and is formed in the same manner as the structure in FIGS. 1J, 2J and 3J.

Figure 4B:
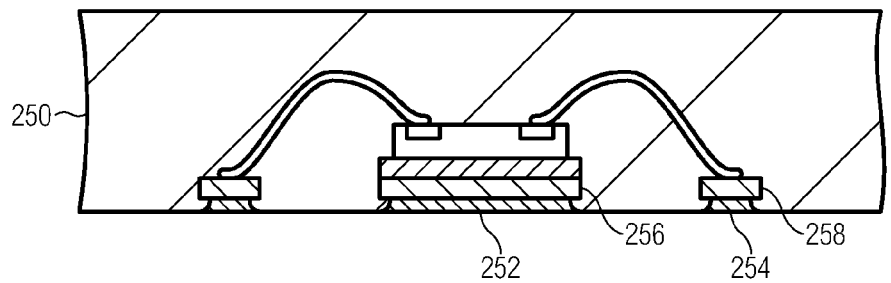
Figure 5B:
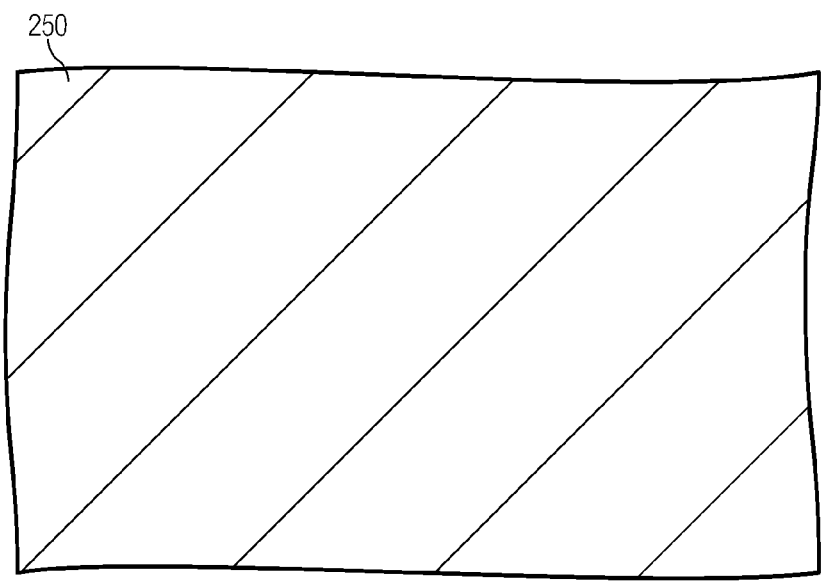
Figure 6B:
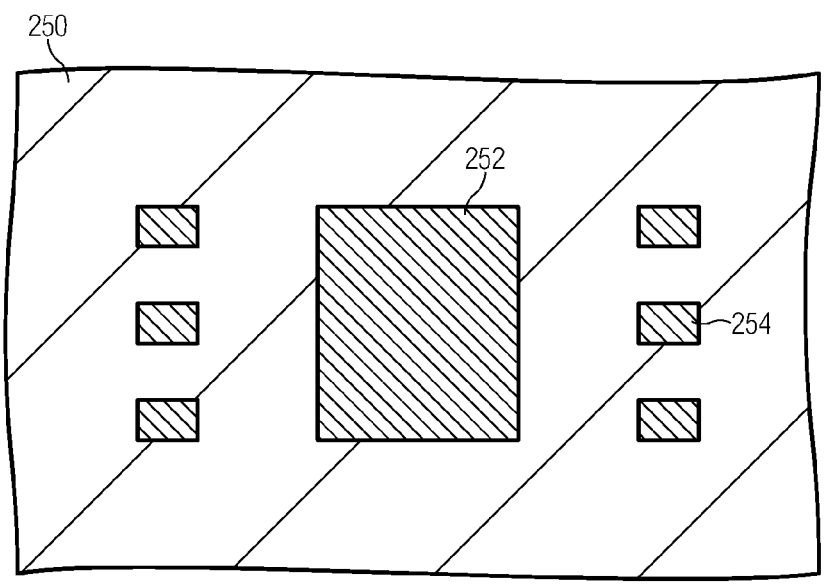

FIGS. 4B, 5B and 6B illustrate cross-sectional, top and bottom views, respectively, of first contact pad 252 and second contact pad 254 formed on first bump 224 and second bump 226 by electroless plating.

In one example, contact pads 252 and 254 have a thickness of 10 microns (rather than 4.6 microns). The nickel-phosphorus layer has a thickness of 9.9 microns (rather than 4.5 microns) and the gold layer has a thickness of 0.1 microns. As a result, contact pads 252 and 254 (and terminals 256 and 258) are aligned with (rather than recessed relative to) encapsulant 250 at the lower surface that faces in the downward direction.

Figure 4C:
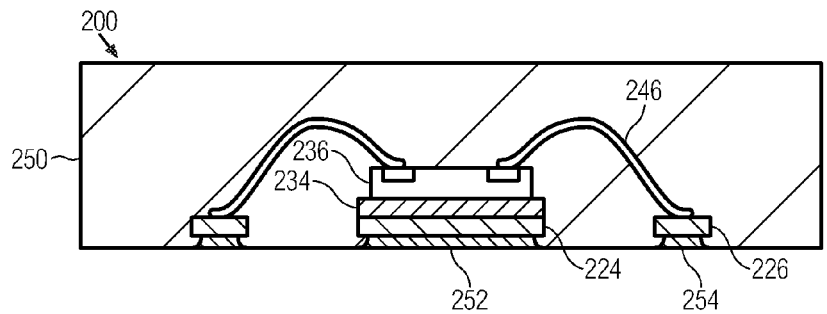
Figure 5C:
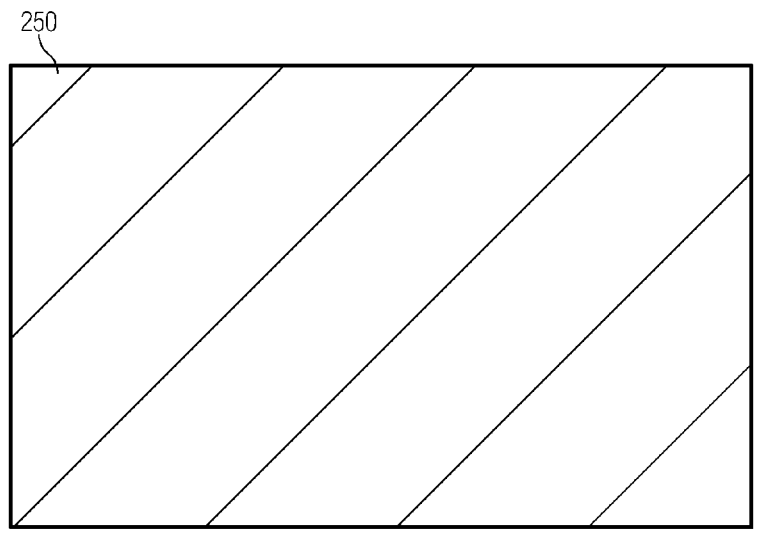
Figure 6C:
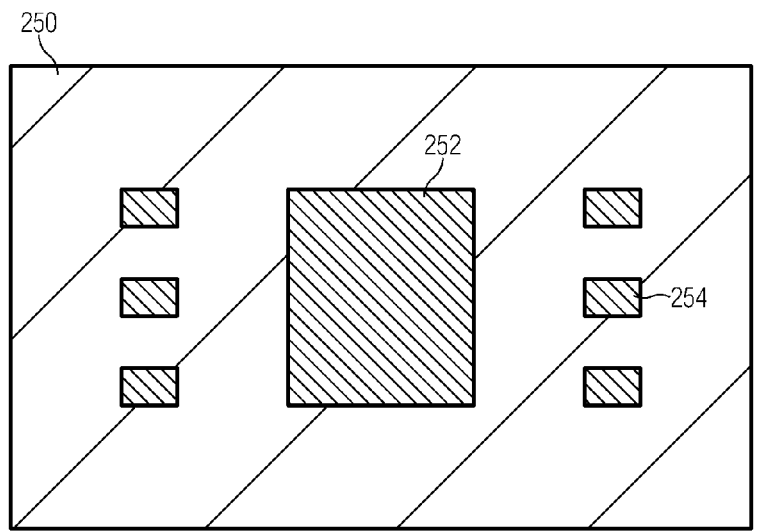

FIGS. 4C, 5C and 6C illustrate cross-sectional, top and bottom views, respectively, of semiconductor package 260 that includes first bump 224, second bump 226, adhesive 234, chip 236, wire bond 246, encapsulant 250, first contact pad 252 and second contact pad 254 after encapsulant 250 is sawed with an excise blade at to singulate it from other semiconductor packages.

Semiconductor package 260 is a single-chip first-level LGA package in which terminals 256 and 258 are aligned with encapsulant 250.

FIGS. 7A-7C, 8A-8C and 9A-9C illustrate cross-sectional, top and bottom views, respectively, of a method of manufacturing a semiconductor package in accordance with a third embodiment. In the third embodiment, the semiconductor package is a BGA package with the terminal protruding from the encapsulant. For purposes of brevity, any description in the first embodiment is incorporated in the third embodiment and need not be repeated, and elements of the third embodiment similar to those in the first embodiment have corresponding reference numerals indexed at three-hundred rather than one-hundred. For instance, first bump 324 corresponds to first bump 124, second bump 326 corresponds to second bump 126, etc.

Figure 7A:
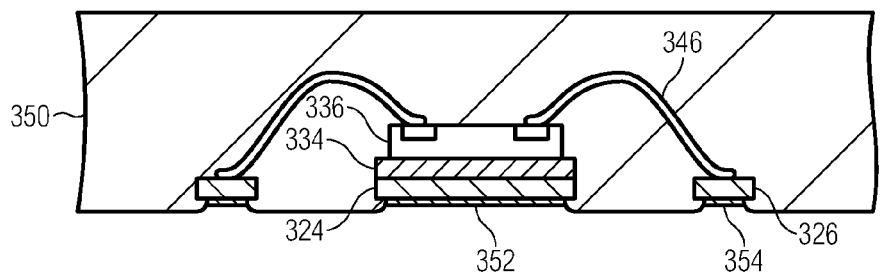
FIGS. 7A-7D illustrate cross-sectional views of a method of manufacturing a semiconductor package in accordance with one embodiment.
Figure 8A:
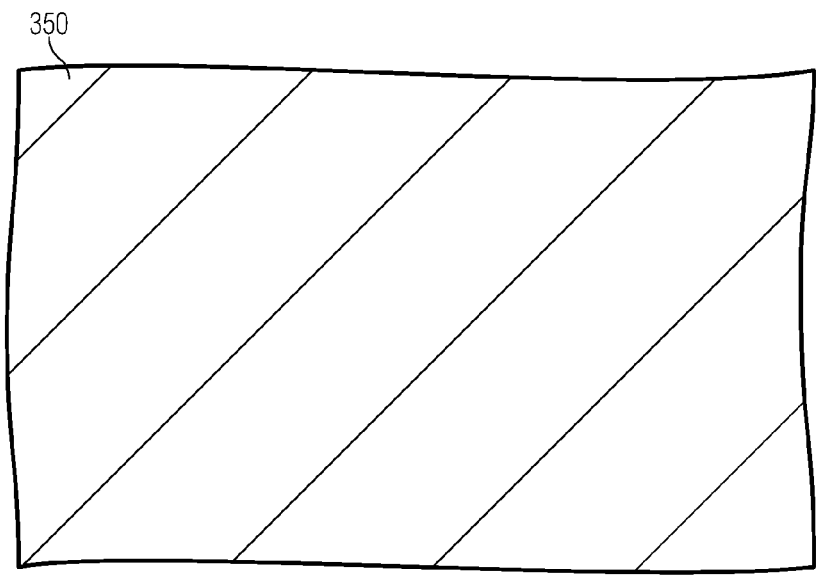
FIGS. 8A-8D illustrate top views that correspond to FIGS. 7A-7D, respectively.
Figure 9A:
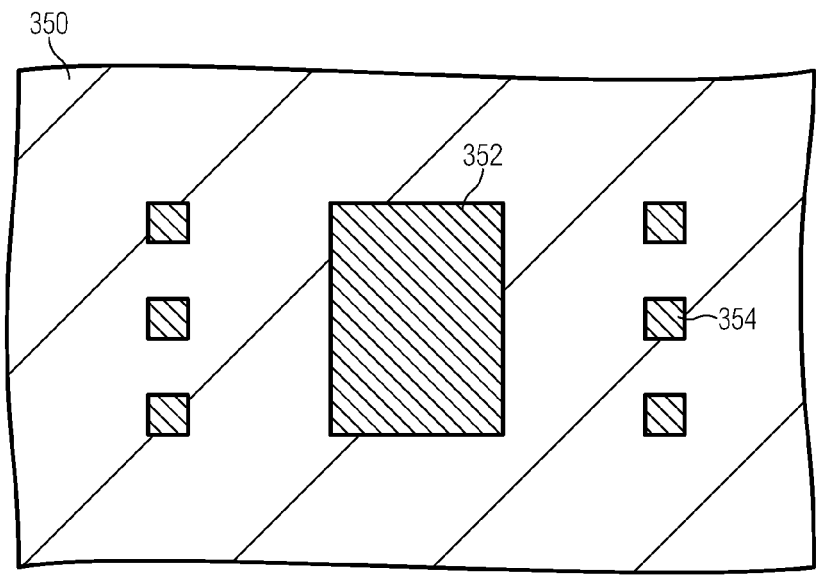
FIGS. 9A-9D illustrate bottom views that correspond to FIGS. 7A-7D, respectively.

FIGS. 7A, 8A and 9A illustrate cross-sectional, top and bottom views, respectively, of first bump 324, second bump 326, adhesive 334, chip 336, wire bond 346, encapsulant 350, first contact pad 350 and second contact pad 352 after contact pads 350 and 352 are formed. The structure corresponds to and is formed in the same manner as the structure in FIGS. 1K, 2K and 3K.

Figure 7B:
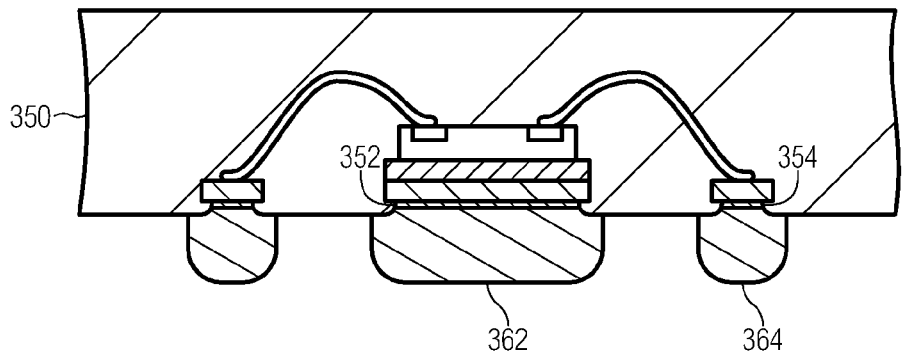
Figure 8B:
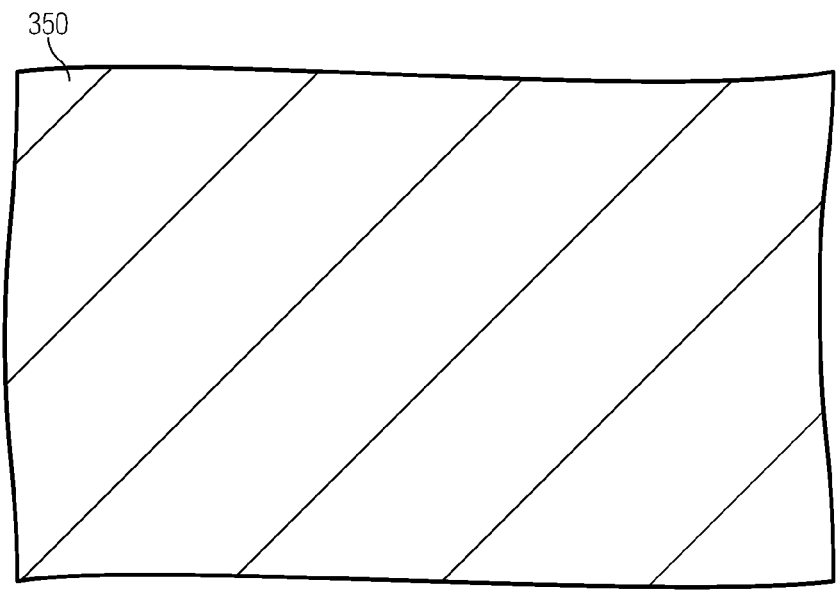
Figure 9B:
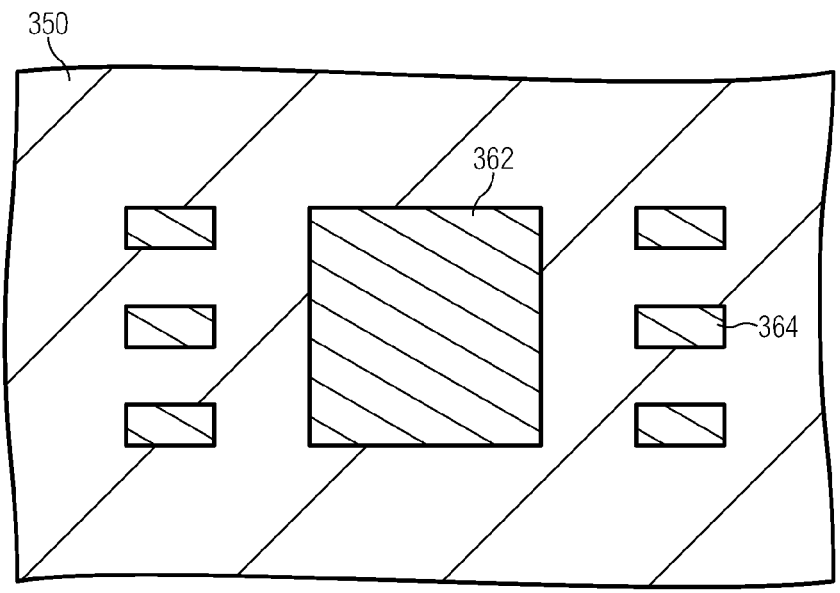

FIGS. 7B, 8B and 9B illustrate cross-sectional, top and bottom views, respectively, of first solder paste portion 362 deposited on first contact pad 352 and second solder paste portion 364 deposited on second contact pad 354 using a dispenser.

Solder paste portions 362 and 364 are illustrated extending below contact pads 352 and 354 to retain a single orientation throughout the drawings, although in this process the structure is inverted so that gravitational force assists the dispensing.

Figure 7C:
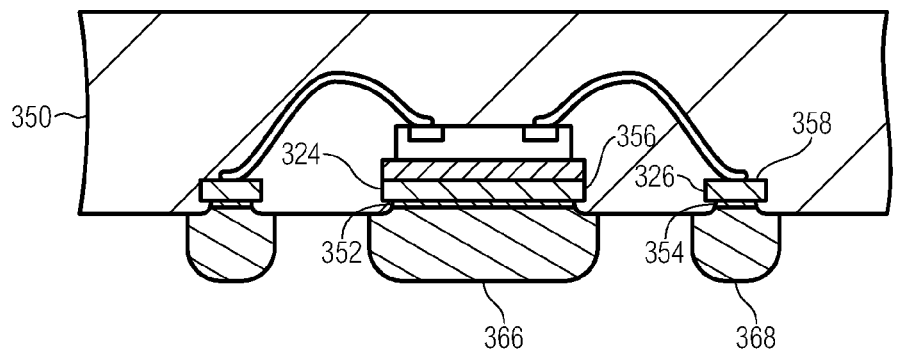
Figure 8C:
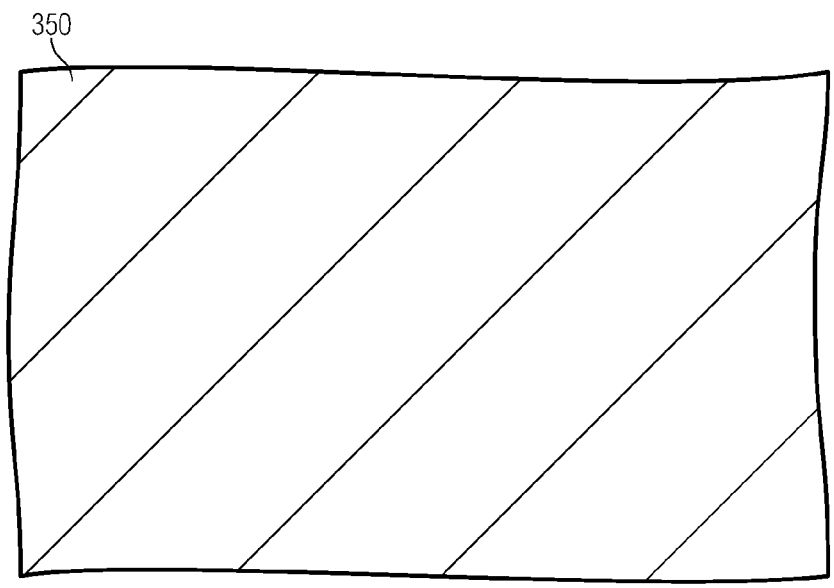
Figure 9C:
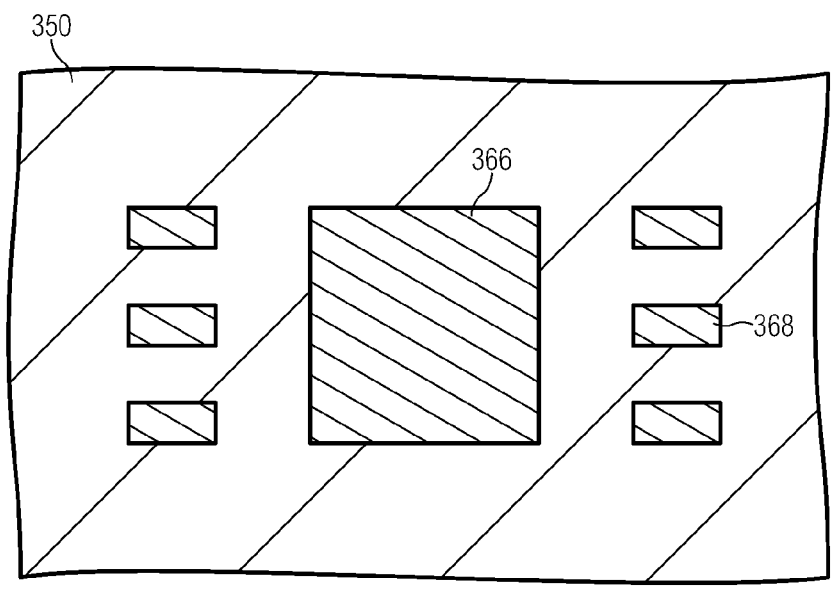

FIGS. 7C, 8C and 9C illustrate cross-sectional, top and bottom views, respectively, of first solder paste portion 362 reflowed into first solder ball 366 and second solder paste portion 364 reflowed into second solder ball 368.

Solder paste portions 362 and 364 are reflowed by applying heat to form solder balls 366 and 368 as hardened solder joints that contact and are electrically and thermally connected to contact pads 352 and 354. Furthermore, solder balls 366 and 368 form intermetallic layers with contact pads 352 and 354, thereby further strengthening the mechanical attachment of terminals 356 and 358 to the structure.

Solder balls 366 and 368 have a thickness of 300 microns. As a result, solder balls 366 and 368 (and terminals 356 and 358) protrude below (rather than recess relative to) encapsulant 350 at the lower surface that faces in the downward direction.

Solder balls 366 and 368 are illustrated extending below contact pads 352 and 354 to retain a single orientation throughout the drawings, although in this process the structure is inverted so that gravitational force assists the reflowing.

Figure 7D:
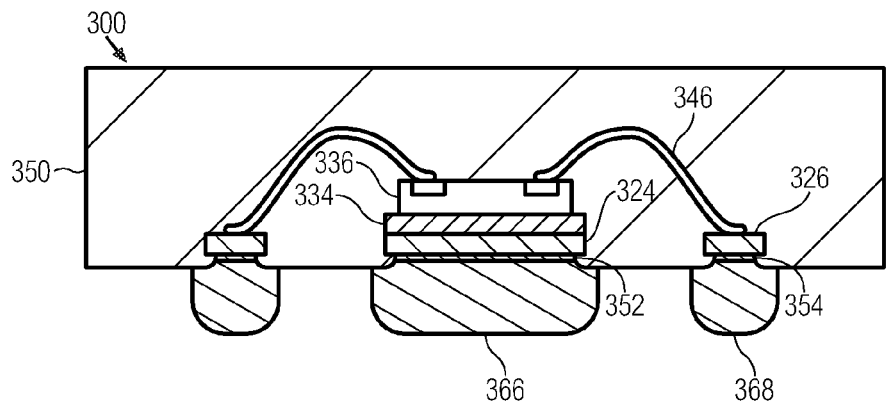
Figure 8D:
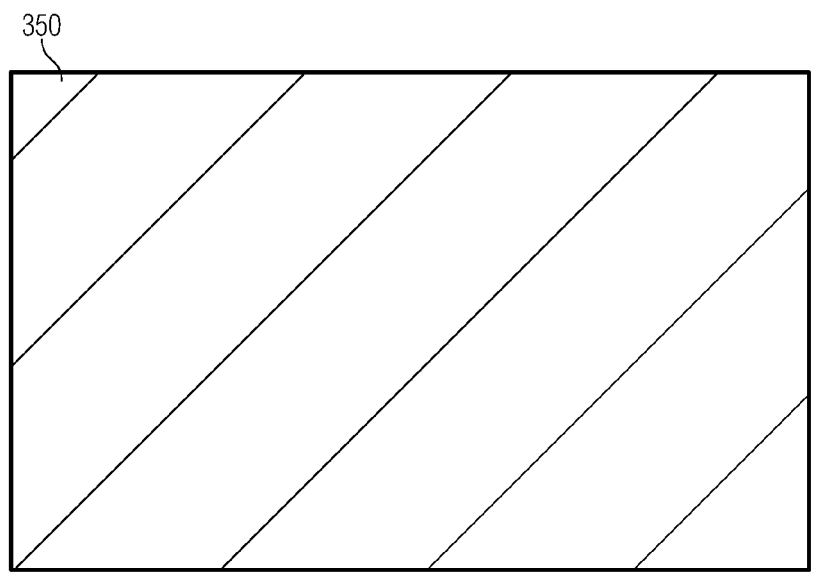
Figure 9D:
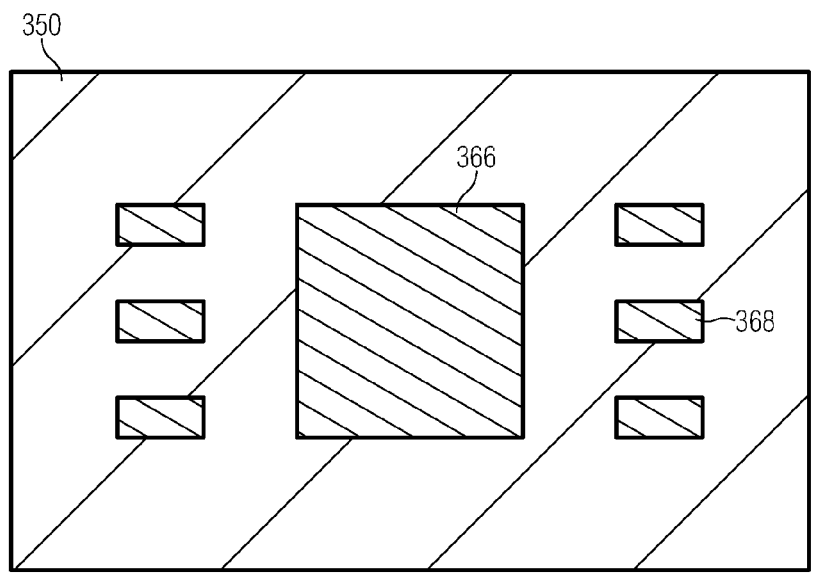

FIGS. 7D, 8D and 9D illustrate cross-sectional, top and bottom views, respectively, of semiconductor package 360 that includes first bump 324, second bump 326, adhesive 334, chip 336, wire bond 346, encapsulant 350, first contact pad 352, second contact pad 354, first solder ball 366 and second solder ball 368 after encapsulant 350 is sawed with an excise blade at to singulate it from other semiconductor packages.

Semiconductor package 360 is a single-chip first-level BGA package in which terminals 356 and 358 protrude from encapsulant 350.

The semiconductor packages and manufacturing methods described above are merely exemplary. Numerous other embodiments are contemplated.

The carrier can be various metals such as copper, nickel, silver, gold, aluminum, alloys thereof and layers thereof as well as other materials such as plastic, rubber and paper.

The bumps can be various metals such as copper, nickel, silver, gold, aluminum, solder, alloys thereof and layers thereof provided they differ from the carrier so that a subsequent etch to provide the gaps and/or remove the carrier is selective of the carrier with respect to the bumps. The bumps can be deposited on the carrier by various techniques such as electroplating, electroless plating, printing and chemical vapor deposition. The bumps can be formed simultaneously or sequentially, can be the same or different materials and can have the same or different heights. Furthermore, the bumps can but need not be coplanar with the upper surface of the carrier and with one another.

The gaps can be formed simultaneously or sequentially and can have the same or different depths and lateral undercuts.

The adhesive can be various die attach materials such as epoxy, solder, glue and tape. The chip can be mechanically attached to the first bump and electrically connected to the second bump by various techniques such as wire bonding and solder reflow.

The encapsulant can be various electrical insulators such as plastic, polyimide and epoxy, can include a filler such as silicon dioxide to match its thermal expansion coefficient with the chip, can be deposited on the carrier and into the gaps by various techniques such as transfer molding, compression molding and printing, and can be singulated along two sides that extend lengthwise (for leaded and leadless packages) or four sides (for leadless packages).

The carrier can be removed from the bumps and the encapsulant by various techniques such as wet chemical etching and mechanical displacement.

The first bump (for the chip) and the first gap (for the first bump) are optional. Likewise, the contact pads are optional, and the terminals can comprise, consist essentially of or consist of the bumps.

The semiconductor package can have a wide variety of shapes, sizes and terminals and be a single-chip package or a multi-chip package.

The semiconductor package can be manufactured individually or as a batch with multiple packages. For instance, during batch manufacturing, the bumps for multiple packages can be simultaneously electroplated on the carrier, then the gaps for multiple packages can be simultaneously etched in the carrier, then separate spaced adhesives for the respective packages can be selectively disposed on the corresponding first bumps, then chips can be disposed on the corresponding adhesives, then the adhesives can be simultaneously fully cured, then wire bonds can be formed on the corresponding chip pads and second bumps, then the encapsulant for multiple packages can be formed, then the carrier can be etched and removed, then the contact pads can be simultaneously electrolessly plated on the corresponding bumps and then the encapsulant can be sawed to singulate the packages.

The semiconductor package manufacturing method of the present invention has numerous advantages. The semiconductor package has high performance, high reliability, low thickness and low manufacturing cost. The encapsulant can provide a mold lock for thin bumps, thereby enhancing miniaturization and reliability. The method can conveniently and flexibly batch manufacture LGA and BGA packages by merely adjusting the terminal formation after the carrier is removed.

The above description and examples illustrate embodiments of the present invention, and it will be appreciated that various modifications and improvements can be made without departing from the scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor package, comprising:
   providing a carrier;
   forming a bump on the carrier;
   forming a gap in the carrier that laterally undercuts the bump;
   attaching a semiconductor chip to the carrier;
   electrically connecting the chip to the bump;
   depositing an encapsulant into the gap wherein the encapsulant in the gap extends within a periphery of the bump, thereby interlocking the bump to the encapsulant; and
   removing the carrier from the bump.

2. The method of claim 1, wherein forming the bump comprises electroplating the bump on the carrier.

3. The method of claim 1, wherein forming the gap comprises applying a wet chemical etch to the carrier.

4. The method of claim 1, wherein mechanically attaching the chip to the carrier comprises providing an adhesive between and in contact with the chip and the carrier.

5. The method of claim 1, wherein electrically connecting the chip to the bump includes comprises a wire bond between and in contact with the chip and the bump.

6. The method of claim 1, wherein depositing the encapsulant comprises transfer molding the encapsulant on the chip, the bump and the carrier.

7. The method of claim 1, wherein removing the carrier comprises applying a wet chemical etch to the carrier.

8. The method of claim 1, wherein removing the carrier exposes the bump.

9. A method of manufacturing a semiconductor package, comprising:
   providing a carrier;
   depositing a bump on the carrier;
   forming a gap in the carrier by applying a first wet chemical etch that contacts the carrier and the bump and is selective of the carrier with respect to the bump using the bump as an etch mask for the carrier, wherein the gap laterally undercuts the bump;
   mechanically attaching a semiconductor chip to the carrier;
   electrically connecting the chip to the bump;
   depositing an encapsulant on the chip, the bump and the carrier and into the gap, thereby filling the gap, wherein the encapsulant in the gap contacts the carrier and the bump and extends within a periphery of the bump, thereby interlocking the bump to the encapsulant; and
   removing the carrier from the bump by applying a second wet chemical etch that contacts the carrier, the bump and the encapsulant and is selective of the carrier with respect to the bump and the encapsulant, thereby exposing the bump.

10. The method of claim 9, wherein depositing the bump comprises electroplating the bump on the carrier.

11. The method of claim 9, wherein mechanically attaching the chip to the carrier comprises providing an adhesive between and in contact with the chip and the carrier.

12. The method of claim 9, wherein electrically connecting the chip to the bump comprises providing a wire bond between and in contact with the chip and the bump.

13. A method of manufacturing a semiconductor package, comprising:
providing a carrier;
depositing first and second bumps on the carrier;
forming first and second gaps in the carrier by applying a first wet chemical etch that contacts the carrier and the bumps and is selective of the carrier with respect to the bumps using the bumps as etch masks for the carrier, wherein the first gap laterally undercuts the first bump and the second gap laterally undercuts the second bump;
mechanically attaching a semiconductor chip to the first bump, wherein the chip is within a periphery of the first bump and outside a periphery of the second bump;
electrically connecting the chip to the second bump;
depositing an encapsulant on the chip, the bumps and the carrier and into the gaps, thereby filling the gaps, wherein the encapsulant in the first gap contacts the carrier and the first bump and extends within the periphery of the first bump, thereby interlocking the first bump to the encapsulant, and the encapsulant in the second gap contacts the carrier and the second bump and extends within the periphery of the second bump, thereby interlocking the second bump to the encapsulant; and
removing the carrier from the bumps by applying a second wet chemical etch that contacts the carrier, the bumps and the encapsulant and is selective of the carrier with respect to the bumps and the encapsulant, thereby exposing the bumps.

14. The method of claim 13, wherein depositing the bumps comprises electroplating the bumps on the carrier.

15. The method of claim 13, wherein mechanically attaching the chip to the first bump comprises providing an adhesive between and in contact with the chip and the first bump.

16. The method of claim 13, wherein electrically connecting the chip to the second bump comprises providing a wire bond between and in contact with the chip and the second bump.

17. A method of manufacturing a semiconductor package, comprising:
providing a carrier that comprises first and second opposing major surfaces, wherein the first surface of the carrier faces in a first direction, the second surface of the carrier faces in a second direction opposite the first direction, and the first and second directions are orthogonal to a lateral direction;
depositing first and second bumps on the carrier, wherein the first bump comprises first and second opposing major surfaces, the second bump comprises first and second opposing major surfaces, the first surfaces of the bumps face in the first direction and are coplanar with one another, the second surfaces of the bumps face in the second direction and are coplanar with one another, and the bumps are laterally spaced from one another;
forming first and second gaps in the carrier by applying a first wet chemical etch that contacts the carrier and the bumps and is selective of the carrier with respect to the bumps using the bumps as etch masks for the carrier, wherein the first gap laterally undercuts the first bump and exposes the second surface of the first bump, the second gap laterally undercuts the second bump and exposes the second surface of the second bump, and the gaps are laterally spaced from one another;
mechanically attaching a semiconductor chip to the first bump, wherein the chip comprises first and second opposing major surfaces, the first surface of the chip comprises a chip pad that transfers an electrical signal between the chip and external circuitry during operation of the chip, and the chip is within a periphery of the first bump and outside a periphery of the second bump;
electrically connecting the chip pad to the second bump;
depositing an encapsulant on the chip, the bumps and the carrier and into the gaps, thereby filling the gaps, wherein the encapsulant in the first gap contacts the carrier and the first bump and extends within the periphery of the first bump and contacts and covers the periphery of the first bump in the second direction, thereby interlocking the first bump to the encapsulant, the encapsulant in the second gap contacts the carrier and the second bump and extends within the periphery of the second bump and contacts and covers the periphery of the second bump in the second direction, thereby interlocking the second bump to the encapsulant, and the encapsulant contacts and protects the chip, extends beyond the chip, the bumps and the carrier in the first direction and is electrically insulative; and
removing the carrier from the bumps by applying a second wet chemical etch that contacts the carrier, the bumps and the encapsulant and is selective of the carrier with respect to the bumps and the encapsulant, thereby exposing the second surfaces of the bumps without exposing the peripheries of the bumps and without exposing the chip.

18. The method of claim 17, wherein:
depositing the bumps comprises electroplating the bumps on the carrier;
mechanically attaching the chip to the first bump comprises providing an adhesive between and in contact with the chip and the first bump;
electrically connecting the chip pad to the second bump comprises providing a wire bond that contacts the chip pad and the second bump; and
depositing the encapsulant comprises transfer molding the encapsulant on the chip, the bumps and the carrier.

19. The method of claim 17, wherein depositing the bumps comprises:
depositing a photoresist layer over the first surface of the carrier, wherein the photoresist layer comprises first and second openings;
depositing the first bump through the first opening and the second bump through the second opening by electroplating using the carrier as a plating base; and
removing the photoresist layer from the carrier.

20. The method of claim 17, wherein mechanically attaching the chip to the second bump comprises:
depositing an adhesive in an uncured stage on the first bump;
depositing the chip on the adhesive in the uncured stage; and
curing the adhesive such that the adhesive is hardened and contacts and is sandwiched between and rigidly attaches the chip and the first bump.

* * * * *

UNITED STATES PATENT AND TRADEMARK OFFICE
CERTIFICATE OF CORRECTION

| | | |
|---|---|---|
| PATENT NO. | : 7,838,332 B2 | Page 1 of 1 |
| APPLICATION NO. | : 12/324327 | |
| DATED | : November 23, 2010 | |
| INVENTOR(S) | : Goh et al. | |

It is certified that error appears in the above-identified patent and that said Letters Patent is hereby corrected as shown below:

Column 10, line 35, delete "bump includes comprises" and insert in place thereof --bump comprises--.

Signed and Sealed this
Twenty-ninth Day of March, 2011

David J. Kappos
*Director of the United States Patent and Trademark Office*